(12) United States Patent
Yang et al.

(10) Patent No.: US 10,819,332 B2
(45) Date of Patent: Oct. 27, 2020

(54) DRIVING CIRCUIT OF A POWER CIRCUIT AND A PACKAGE STRUCTURE THEREOF

(71) Applicant: Delta Electronics, Inc., Taoyuan (TW)

(72) Inventors: Chang-Jing Yang, Taoyuan (TW); Liang-Cheng Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/403,396

(22) Filed: May 3, 2019

(65) Prior Publication Data

US 2019/0260375 A1 Aug. 22, 2019

Related U.S. Application Data

(63) Continuation-in-part of application No. 15/495,009, filed on Apr. 24, 2017, now Pat. No. 10,326,438,
(Continued)

(51) Int. Cl.
| | |
|---|---|
| H03K 17/16 | (2006.01) |
| H03K 3/3565 | (2006.01) |
| H02M 3/07 | (2006.01) |
| H02M 1/44 | (2007.01) |
| H02M 1/08 | (2006.01) |
| H02M 3/158 | (2006.01) |
| H02M 1/00 | (2006.01) |

(52) U.S. Cl.
CPC ............ *H03K 17/162* (2013.01); *H02M 1/08* (2013.01); *H02M 1/44* (2013.01); *H02M 3/07* (2013.01); *H02M 3/158* (2013.01); *H03K 3/3565* (2013.01); *H02M 2001/0006* (2013.01); *H03K 2217/0063* (2013.01); *H03K 2217/0072* (2013.01); *H03K 2217/0081* (2013.01)

(58) Field of Classification Search
CPC ..................................................... H03K 17/162
USPC ................................................. 327/108–112
See application file for complete search history.

(56) References Cited

U.S. PATENT DOCUMENTS 5,648,735 A 7/1997 Bowers et al.
5,818,209 A * 10/1998 Masini ................. H03F 3/2171
323/289
(Continued)

FOREIGN PATENT DOCUMENTS

JP H10294421 A 11/1998
TW 201823905 A 7/2018
(Continued)

OTHER PUBLICATIONS

Taiwanese Office Action and Search Report which corresponds to Application No. 108126449; dated Dec. 30, 2019.
(Continued)

*Primary Examiner* — Tomi Skibinski
(74) *Attorney, Agent, or Firm* — Muncy, Geissler, Olds & Lowe, P.C.

(57) ABSTRACT

An integrated circuit includes a first power transistor, a second power transistor, and an isolator. The first power transistor is integrated with a first driving circuit. The second power transistor is integrated with a second driving circuit. The isolator provides a first control signal and a second control signal to the first power transistor and a second power transistor respectively, according to an input signal.

45 Claims, 22 Drawing Sheets

Related U.S. Application Data which is a continuation-in-part of application No. 15/395,738, filed on Dec. 30, 2016, now Pat. No. 9,906,221, application No. 16/403,396, which is a continuation-in-part of application No. 16/262,421, filed on Jan. 30, 2019.

(56) References Cited

U.S. PATENT DOCUMENTS

| | | |
|---|---|---|
| 6,515,461 B2 | 2/2003 | Akiyama et al. |
| 6,885,225 B2 | 4/2005 | Ohmichi et al. |
| 7,606,085 B2 | 10/2009 | Wada et al. |
| 7,986,180 B2 | 7/2011 | Lee et al. |
| 9,525,413 B2 | 12/2016 | Roberts et al. |
| 9,780,773 B2 | 10/2017 | Kawata et al. |
| 2008/0157830 A1 | 7/2008 | Kume |
| 2009/0039950 A1 | 2/2009 | Takeuchi |
| 2011/0084607 A1* | 4/2011 | Hopper ............... H05B 45/00 315/53 |
| 2012/0049899 A1 | 3/2012 | Natani et al. |
| 2016/0300797 A1 | 10/2016 | Shim et al. |
| 2019/0122969 A1 | 4/2019 | Lee et al. |

FOREIGN PATENT DOCUMENTS

| | | |
|---|---|---|
| TW | I637595 B | 10/2018 |
| WO | WO2016209172 A1 | 12/2016 |

OTHER PUBLICATIONS

The Office Action of its related TW application No. 108129940 dated Feb. 3, 2020, 9 pages.

Partial European search report dated Apr. 8, 2020 for the corresponding application No. 19218337.4 in Europe, 31 pages.

* cited by examiner

DRIVING CIRCUIT OF A POWER CIRCUIT AND A PACKAGE STRUCTURE THEREOF

CROSS REFERENCE TO RELATED APPLICATIONS

This application is a Continuation-In-Part of pending U.S. patent application Ser. No. 15/495,009, filed Apr. 24, 2017 and entitled "A DRIVING CIRCUIT OF A POWER CIRCUIT AND A REGULATOR", which is a Continuation-In-Part of pending prior application Ser. No. 15/395,738, filed Dec. 30, 2016, and entitled "A DRIVING CIRCUIT OF A POWER CIRCUIT".

The present application is a continuation-in-part of and claims priority from U.S. patent application Ser. No. 16/262,421, filed Jan. 30, 2019, the content of which is hereby incorporated by reference in its entirety.

BACKGROUND OF THE INVENTION

Field of the Invention

The disclosure relates generally to driving circuits and isolators integrated with GaN power transistors, and more specifically it relates to a package structure including the driving circuits, isolators, and GaN power transistors.

Description of the Related Art

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, so that the first power transistor 110A can be fully turned on. Therefore, the first power transistor 110A supplied with the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfere with the boost voltage VB when the boost capacitor CB is charged through the power transistor. Therefore, it is necessary to eliminate parasitic effects from the driving circuit.

BRIEF SUMMARY OF THE INVENTION

In an embodiment, an integrated circuit comprises a first power transistor, a second power transistor, and an isolator. The first power transistor is integrated with a first driving circuit. The second power transistor is integrated with a second driving circuit. The isolator provides a first control signal and a second control signal to the first power transistor and a second power transistor respectively, according to an input signal.

According to an embodiment of the invention, the integrated circuit further comprises a first power circuit and a second power circuit, wherein the first power circuit comprises the first driving circuit and the first power transistor, wherein the second power circuit comprises the second driving circuit and the second power transistor.

According to an embodiment of the invention, the integrated circuit further comprises a bootstrap diode and a bootstrap capacitor. The bootstrap diode comprises a bootstrap anode and a bootstrap cathode, wherein the bootstrap anode is coupled to a first supply voltage and the bootstrap cathode is coupled to a second supply voltage. The bootstrap capacitor is coupled between the second supply voltage and a switch voltage of a switch node.

According to an embodiment of the invention, the first driving circuit is supplied by the second supply voltage and the switch voltage and generates a first driving voltage at a first driving node according to the first control signal. The first power transistor supplies a high voltage to the switch node according to the first driving voltage.

According to an embodiment of the invention, the second driving circuit is supplied by the first supply voltage and a first ground and generates a second driving voltage at a second driving node according to the second control signal. The second power transistor pulls the switch voltage down to the first ground according to the second driving voltage.

According to an embodiment of the invention, each of the first power transistor and the second power transistor is a GaN transistor.

According to an embodiment of the invention, the high voltage exceeds the first supply voltage and the second supply voltage.

According to an embodiment of the invention, the isolator comprises a first sub-isolator and a second sub-isolator. The first sub-isolator comprises a first transmitter, a first receiver, and a first isolation barrier. The first transmitter is supplied with a third supply voltage and a second ground and transmits a first radio signal according to the input signal. The first receiver is supplied with the second supply voltage and the switch voltage and generates the first control signal according to the first radio signal. The first isolation barrier is configured to electrically isolate the first transmitter from the first receiver. The second sub-isolator comprises a second transmitter, a second receiver, and a second isolation barrier. The second transmitter is supplied with a third supply voltage and a second ground and transmits a second radio signal according to the input signal. The second receiver is supplied with the first supply voltage and the first ground and generates the first control signal according to the first radio signal. The second isolation barrier is configured to electrically isolate the second transmitter from the second receiver.

According to an embodiment of the invention, the isolator comprises: a transmitter, a first receiver, a first isolation barrier, a second receiver, and a second isolation barrier. The transmitter is supplied with a third supply voltage and a second ground and transmits a first radio signal and a second radio signal according to the input signal. The first receiver is supplied with the second supply voltage and the switch voltage and generates the first control signal according to the first radio signal. The first isolation barrier is configured to electrically isolate the transmitter from the first receiver. The second receiver is supplied with the first supply voltage and the first ground and generates the second control signal according to the second radio signal. The second isolation barrier is configured to electrically isolate the transmitter from the second receiver.

According to an embodiment of the invention, the integrated circuit further comprises a decoupling capacitor. The decoupling capacitor is coupled between the high voltage and the first ground, wherein the first sub-isolator, the second sub-isolator, the first power circuit, a second power circuit, and the decoupling capacitor are packaged together.

According to an embodiment of the invention, each of the first power circuit and the second power circuit comprises a pre-driver. The pre-driver generates a first internal signal according to the control signal, wherein the pre-driver is configured to improve driving capability of the control signal, wherein the driving circuit generates the driving voltage according to the first internal signal.

According to an embodiment of the invention, each of the first driving circuit and the second driving circuit comprises a high-side transistor, a low-side transistor, and a charge pump. The high-side transistor provides a supply voltage to a driving node according to a high-side voltage of a high-side node. The low-side transistor couples the driving node to the ground according to a first internal signal. The charge pump is coupled to the high-side node and the driving node, wherein the charge pump is configured to generate a high-side voltage that exceeds the supply voltage according to the first internal signal.

According to an embodiment of the invention, each of the first power circuit and the second power circuit comprises a hysteresis circuit. The hysteresis circuit is coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.

According to an embodiment of the invention, the hysteresis circuit comprises a first resistor, a third normally-off transistor, a fourth normally-off transistor, a fifth normally-off transistor, and a second resistor. The first resistor is coupled between the supply voltage and an output node, wherein the second internal signal is generated at the output node. The third normally-off transistor comprises a gate terminal coupled to a third node, a source terminal coupled to a fourth node, and a drain terminal coupled to the output node. The fourth normally-off transistor comprises a gate terminal coupled to the third node, a source terminal coupled to the ground, and a drain terminal coupled to the fourth node. The fifth normally-off transistor comprises a gate terminal coupled to the output node, a source terminal coupled to the fourth node, and a drain terminal supplied by the supply voltage. The second resistor is coupled to the third node and receives the control signal.

According to an embodiment of the invention, the pre-driver comprises a first sub pre-driver, a second sub pre-driver, a third sub pre-driver, and a fourth sub pre-driver. The first sub pre-driver generates the first internal signal according to a first sub-internal signal. The second sub pre-driver generates the first sub-internal signal according to a second sub-internal signal. The third sub pre-driver generates the second sub-internal signal according to a third internal signal. The fourth sub pre-driver generates the third sub-internal signal according to the second internal signal.

According to an embodiment of the invention, the first sub pre-driver comprises: a first sub normally-off transistor, a second sub normally-off transistor, and a first sub normally-on transistor. The first sub normally-off transistor comprises a gate terminal receiving the first sub-internal signal, a source terminal coupled to the ground, and a drain terminal generating the first internal signal. The second sub normally-off transistor comprises a gate terminal receiving the second sub-internal signal, a source terminal coupled to the drain terminal of the first sub normally-off transistor, and a drain terminal supplied with the supply voltage. The first sub normally-on transistor comprises a gate terminal coupled to the drain terminal of the first sub normally-off transistor, a source terminal coupled to the drain terminal of the first sub normally-off transistor, and a drain terminal supplied with the supply voltage.

According to an embodiment of the invention, the second sub pre-driver comprises: a third sub normally-off transistor, a fourth sub normally-off transistor, and a second sub normally-on transistor. The third sub normally-off transistor comprises a gate terminal receiving the second sub-internal signal, a source terminal coupled to the ground, and a drain terminal generating the first sub-internal signal. The fourth sub normally-off transistor comprises a gate terminal receiving the third sub-internal signal, a source terminal coupled to the drain terminal of the third sub normally-off transistor, and a drain terminal supplied with the supply voltage. The second sub normally-on transistor comprises a gate terminal coupled to the drain terminal of the third sub normally-off transistor, a source terminal coupled to the drain terminal of the third sub normally-off transistor, and a drain terminal supplied with the supply voltage.

According to an embodiment of the invention, the third sub pre-driver comprises: a fifth sub normally-off transistor, a sixth sub normally-off transistor, and a third sub normally-on transistor. The fifth sub normally-off transistor comprises a gate terminal receiving the third sub-internal signal, a source terminal coupled to the ground, and a drain terminal generating the second sub-internal signal. The sixth sub normally-off transistor comprises a gate terminal receiving the second internal signal, a source terminal coupled to the drain terminal of the fifth sub normally-off transistor, and a drain terminal supplied with the supply voltage. The third sub normally-on transistor comprises a gate terminal coupled to the drain terminal of the fifth sub normally-off transistor, a source terminal coupled to the drain terminal of the fifth sub normally-off transistor, and a drain terminal supplied with the supply voltage.

According to an embodiment of the invention, the fourth sub pre-driver comprises: a seventh sub normally-off transistor, an eighth sub normally-off transistor, and a fourth sub normally-on transistor. The seventh sub normally-off transistor comprises a gate terminal receiving the second internal signal, a source terminal coupled to the ground, and a drain terminal generating the third sub-internal signal. The eighth sub normally-off transistor comprises a gate terminal coupled to the third node of the first hysteresis circuit, a source terminal coupled to the drain terminal of the seventh sub normally-off transistor, and a drain terminal supplied with the supply voltage. The fourth sub normally-on transistor comprises a gate terminal coupled to the drain terminal of the seventh sub normally-off transistor, a source terminal coupled to the drain terminal of the seventh sub normally-off transistor, and a drain terminal supplied with the supply voltage.

According to an embodiment of the invention, the high-side transistor and the low-side transistor are normally-off transistors.

According to an embodiment of the invention, the charge pump comprises: a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when a voltage of the second node exceeds a voltage of the high-side node. The third unidirectional conducting device unidirectionally provides the driving voltage to the second node when the driving voltage exceeds the voltage of the second node. The switch receives the control signal and is configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch. When the control signal is at a low voltage level, the switch is turned OFF, the third unidirectional conducting device provides the driving voltage to the second node, and the capacitor is discharged to the high-side node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, each of the first driving circuit and the second driving circuit further comprises: a high-side normally-on transistor. The high-side normally-on transistor comprises a source terminal coupled to the driving node, a gate terminal coupled to the driving node, and a drain terminal supplied with the supply voltage, wherein the high-side normally-on transistor is configured to improve driving capability of the high-side transistor.

In an embodiment, a package structure comprises a substrate, a decoupling capacitor, an integrated circuit, and a wiring layer. The decoupling capacitor is provided on the substrate. The integrated circuit is bonded to the decoupling capacitor in a first dielectric layer. The wiring layer is configured to electrically couple the decoupling capacitor to the integrated circuit, wherein the wiring layer is provided on the first dielectric layer through a second dielectric layer.

According to an embodiment of the invention, the decoupling capacitor comprises: a first conductive element, a first dielectric element, and a second conductive element. The first conductive element is formed in the first dielectric layer. The first dielectric element is formed on the first conductive element. The second conductive element is formed on the first dielectric element.

According to an embodiment of the invention, the package structure further comprises a bootstrap capacitor. The bootstrap capacitor is provided on the substrate, wherein the integrated circuit is bonded to the bootstrap capacitor in the first dielectric layer.

According to an embodiment of the invention, the bootstrap capacitor comprises: a third conductive element, a second dielectric element, and a fourth conductive element. The third conductive element is formed in the first dielectric layer. The second dielectric element is formed on the third conductive element. The fourth conductive element is formed on the second dielectric element.

According to an embodiment of the invention, a material of the first dielectric element and the second dielectric element is different than a material of the first dielectric layer and a material of the second dielectric layer.

According to an embodiment of the invention, the integrated circuit comprises: an isolator, a first power circuit, and a second power circuit. The isolator generates a first control signal a second control signal according to an input signal. The first power circuit comprises: a first driving circuit and a first power transistor. The first driving circuit is supplied by a second supply voltage and a switch voltage and generates a first driving voltage at a first driving node according to the first control signal, wherein a bootstrap diode and the bootstrap capacitor are configured to boost a first supply voltage into the second supply voltage, wherein the bootstrap diode comprises a bootstrap anode coupled to the first supply voltage and a bootstrap cathode coupled to the second supply voltage, wherein the bootstrap capacitor is coupled between the second supply voltage and the switch voltage of a switch node. The first power transistor supplies a high voltage to the switch node according to the first driving voltage. The second power circuit comprises: a second driving circuit and a second power transistor. The second driving circuit is supplied by the first supply voltage and a first ground and generates a second driving voltage at a second driving node according to the second control signal. The second power transistor pulls the switch voltage down to the first ground according to the second driving voltage.

According to an embodiment of the invention, each of the first power transistor and the second power transistor is a GaN transistor.

According to an embodiment of the invention, the high voltage exceeds the first supply voltage and the second supply voltage.

According to an embodiment of the invention, the isolator comprises: a first sub-isolator and a second sub-isolator. The first sub-isolator comprises a first transmitter, a first receiver, and a first isolation barrier. The first transmitter is supplied with a third supply voltage and a second ground and transmits a first radio signal according to the input signal. The first receiver is supplied with the second supply voltage and the switch voltage and generates the first control signal according to the first radio signal. The first isolation barrier is configured to electrically isolate the first transmitter from the first receiver. The second sub-isolator comprises: a second transmitter, a second receiver, and a second isolation barrier. The second transmitter is supplied with a third supply voltage and a second ground and transmits a second radio signal according to the input signal. The second receiver is supplied with the first supply voltage and the first ground and generates the first control signal according to the first radio signal. The second isolation barrier is configured to electrically isolate the second transmitter from the second receiver.

According to an embodiment of the invention, the decoupling capacitor is coupled between the high voltage and the first ground.

According to an embodiment of the invention, each of the first power circuit and the second power circuit comprises: a pre-driver. The pre-driver generates a first internal signal according to the control signal, wherein the pre-driver is configured to improve driving capability of the control signal, wherein the driving circuit generates the driving voltage according to the first internal signal.

According to an embodiment of the invention, each of the first driving circuit and the second driving circuit comprises: a high-side transistor, a low-side transistor, and a charge pump. The high-side transistor provides a supply voltage to a driving node according to a high-side voltage of a high-side node. The low-side transistor couples the driving node to the ground according to a first internal signal. The charge pump is coupled to the high-side node and the driving node, wherein the charge pump is configured to generate a high-side voltage that exceeds the supply voltage according to the first internal signal.

According to an embodiment of the invention, each of the first power circuit and the second power circuit comprises: a hysteresis circuit. The hysteresis circuit is coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.

According to an embodiment of the invention, the hysteresis circuit comprises: a first resistor, a third normally-off transistor, a fourth normally-off transistor, a fifth normally-off transistor, and a second resistor. The first resistor is coupled between the supply voltage and an output node, wherein the second internal signal is generated at the output node. The third normally-off transistor comprises a gate terminal coupled to a third node, a source terminal coupled to a fourth node, and a drain terminal coupled to the output node. The fourth normally-off transistor comprises a gate terminal coupled to the third node, a source terminal coupled to the ground, and a drain terminal coupled to the fourth node. The fifth normally-off transistor comprises a gate terminal coupled to the output node, a source terminal coupled to the fourth node, and a drain terminal supplied by the supply voltage. The second resistor is coupled to the third node and receiving the control signal.

According to an embodiment of the invention, the pre-driver comprises: a first sub pre-driver, a second sub pre-driver, a third sub pre-driver, and a fourth sub pre-driver. The first sub pre-driver generates the first internal signal according to a first sub-internal signal. The second sub pre-driver generates the first sub-internal signal according to a second sub-internal signal. The third sub pre-driver generates the second sub-internal signal according to a third internal signal. The fourth sub pre-driver generates the third sub-internal signal according to the second internal signal.

According to an embodiment of the invention, the first sub pre-driver comprises: a first sub normally-off transistor, a second sub normally-off transistor, and a first sub normally-on transistor. The first sub normally-off transistor comprises a gate terminal receiving the first sub-internal signal, a source terminal coupled to the ground, and a drain terminal generating the first internal signal. The second sub normally-off transistor comprises a gate terminal receiving the second sub-internal signal, a source terminal coupled to the drain terminal of the first sub normally-off transistor, and a drain terminal supplied with the supply voltage. The first sub normally-on transistor comprises a gate terminal coupled to the drain terminal of the first sub normally-off transistor, a source terminal coupled to the drain terminal of the first sub normally-off transistor, and a drain terminal supplied with the supply voltage.

According to an embodiment of the invention, the second sub pre-driver comprises: a third sub normally-off transistor, a fourth sub normally-off transistor, and a second sub normally-on transistor. The third sub normally-off transistor comprises a gate terminal receiving the second sub-internal signal, a source terminal coupled to the ground, and a drain terminal generating the first sub-internal signal. The fourth sub normally-off transistor comprises a gate terminal receiving the third sub-internal signal, a source terminal coupled to the drain terminal of the third sub normally-off transistor, and a drain terminal supplied with the supply voltage. The second sub normally-on transistor comprises a gate terminal coupled to the drain terminal of the third sub normally-off transistor, a source terminal coupled to the drain terminal of the third sub normally-off transistor, and a drain terminal supplied with the supply voltage.

According to an embodiment of the invention, the third sub pre-driver comprises: a fifth sub normally-off transistor, a sixth sub normally-off transistor, and a third sub normally-on transistor. The fifth sub normally-off transistor comprises a gate terminal receiving the third sub-internal signal, a source terminal coupled to the ground, and a drain terminal generating the second sub-internal signal. The sixth sub normally-off transistor comprises a gate terminal receiving the second internal signal, a source terminal coupled to the drain terminal of the fifth sub normally-off transistor, and a drain terminal supplied with the supply voltage. The third sub normally-on transistor comprises a gate terminal coupled to the drain terminal of the fifth sub normally-off transistor, a source terminal coupled to the drain terminal of the fifth sub normally-off transistor, and a drain terminal supplied with the supply voltage.

According to an embodiment of the invention, the fourth sub pre-driver comprises: a seventh sub normally-off transistor, an eighth sub normally-off transistor, and a fourth sub normally-on transistor. The seventh sub normally-off transistor comprises a gate terminal receiving the second internal signal, a source terminal coupled to the ground, and a drain terminal generating the third sub-internal signal. The eighth sub normally-off transistor comprises a gate terminal coupled to the third node of the first hysteresis circuit, a source terminal coupled to the drain terminal of the seventh sub normally-off transistor, and a drain terminal supplied with the supply voltage. The fourth sub normally-on transistor comprises a gate terminal coupled to the drain terminal of the seventh sub normally-off transistor, a source terminal coupled to the drain terminal of the seventh sub normally-off transistor, and a drain terminal supplied with the supply voltage.

According to an embodiment of the invention, the high-side transistor and the low-side transistor are normally-off transistors.

According to an embodiment of the invention, the charge pump comprises: a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when a voltage of the second node exceeds a voltage of the high-side node. The third unidirectional conducting device unidirectionally provides the driving voltage to the second node when the driving voltage exceeds the voltage of the second node. The switch receives the control signal and configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the driving voltage to the second node, and the capacitor is discharged to the high-side node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, each of the first driving circuit and the second driving circuit further comprises: a high-side normally-on transistor. The high-side normally-on transistor comprises a source terminal coupled to the driving node, a gate terminal coupled to the driving node, and a drain terminal supplied with the supply voltage, wherein the high-side normally-on transistor is configured to improve driving capability of the high-side transistor.

In an embodiment, a method of fabricating a package structure comprises: providing a decoupling capacitor on a substrate; providing an integrated circuit on the substrate; bonding the decoupling capacitor and the integrated circuit through a first dielectric medium to form a first dielectric layer; forming a wiring layer on the first dielectric layer, so that the decoupling capacitor is electrically coupled to the integrated circuit through the wiring layer; and bonding the wiring layer to the first dielectric layer through a second dielectric medium to form a second dielectric layer on the first dielectric layer.

According to an embodiment of the invention, the step of providing the decoupling capacitor on the substrate further comprising: forming a first conductive element in the first dielectric layer; forming a first dielectric element on the first conductive element; and forming a second conductive element on the first dielectric element.

According to an embodiment of the invention, the method further comprises: providing a bootstrap capacitor on the substrate; and bonding the bootstrap capacitor, the decoupling capacitor, and the integrated circuit through the first dielectric medium to form the first dielectric layer.

According to an embodiment of the invention, the step of providing the bootstrap capacitor on the substrate further comprises: forming a third conductive element in the first dielectric layer; forming a second dielectric element on the first conductive element; and forming a fourth conductive element on the second dielectric element.

According to an embodiment of the invention, the integrated circuit comprises: an isolator, a first power circuit, and a second power circuit. The isolator comprises a first supply terminal, a second supply terminal, a third supply terminal, a fourth supply terminal, a first reference terminal, a second reference terminal, a third reference terminal, a fourth reference terminal, a first input terminal, a second input terminal, a first output terminal, and a second output terminal. The first power circuit comprises a fifth supply terminal coupled to the second supply terminal, a sixth supply terminal, a fifth reference terminal coupled to the second reference terminal, and a first PWM terminal coupled to the first output terminal. The second power circuit comprises a seventh supply terminal coupled to the fourth supply terminal, an eighth supply terminal coupled to the fifth reference terminal, a sixth reference terminal, and a second PWM terminal coupled to the second output terminal.

According to an embodiment of the invention, the method further comprises: forming a first conductive layer on the substrate, wherein the first power circuit and the bootstrap capacitor are deposited on the first conductive layer, wherein the first conductive layer is coupled to a first side of the bootstrap capacitor and the fifth reference terminal, and a second side of the bootstrap capacitor is coupled to the fifth supply terminal through the wiring layer, wherein the sixth supply terminal is coupled to a third side of the decoupling capacitor through the wiring layer.

According to an embodiment of the invention, the method further comprises: forming a second conductive layer on the substrate, wherein the second power circuit and the decoupling capacitor are deposited on the second conductive layer, wherein the second conductive layer is coupled to a fourth side of the decoupling capacitor and a sixth reference terminal.

According to an embodiment of the invention, the method further comprises: forming a third conductive layer on the substrate, wherein the isolator is deposited on the third conductive layer.

According to an embodiment of the invention, the first supply terminal and the third supply terminal are supplied with a third supply voltage, the second supply terminal and the fifth supply terminal are supplied with a second supply voltage, the first input terminal receives a input signal, the second input terminal receives a reverse input signal, the first output terminal generates a first control signal, the second output terminal generates a second control signal, the fourth supply terminal and the seventh supply terminal are supplied with a first supply voltage, the sixth supply terminal is supplied with a high voltage, the eighth supply terminal is coupled to the second reference terminal and the fifth reference terminal, the first reference terminal and the third reference terminal are coupled to a second ground, and the fourth reference terminal and the sixth reference terminal are coupled to a first ground, wherein the input signal and the reverse input signal are out-of-phase.

According to an embodiment of the invention, the first power circuit comprises: a first driving circuit and a first power transistor. The first driving circuit is supplied by the second supply voltage and the switch voltage and generates a first driving voltage at a first driving node according to the first control signal. The first power transistor couples the sixth supply terminal to the fifth reference terminal according to the first driving voltage.

According to an embodiment of the invention, the second power circuit comprises: a second driving circuit and a second power transistor. The second driving circuit is supplied by the first supply voltage and a first ground and generating a second driving voltage at a second driving node according to the second control signal. The second power transistor couples the eighth supply terminal to the first ground according to the second driving voltage.

According to an embodiment of the invention, each of the first power transistor and the second power transistor is a GaN transistor.

According to an embodiment of the invention, the integrated circuit further comprises: a bootstrap diode. The bootstrap diode comprises a bootstrap anode and a bootstrap cathode, wherein the bootstrap anode is coupled to a first supply voltage and the bootstrap cathode is coupled to a second supply voltage.

According to an embodiment of the invention, the high voltage exceeds the first supply voltage and the second supply voltage.

According to an embodiment of the invention, the isolator comprises a first sub-isolator and a second sub-isolator. The first sub-isolator comprises a first transmitter, a first receiver, and a first isolation barrier. The first transmitter is supplied with a third supply voltage and a second ground and transmits a first radio signal according to the input signal. The first receiver is supplied with the second supply voltage and the switch voltage and generates the first control signal according to the first radio signal. The first isolation barrier is configured to electrically isolate the first transmitter from the first receiver. The second sub-isolator comprises a second transmitter, a second receiver, and a second isolation barrier. The second transmitter is supplied with a third supply voltage and a second ground and transmits a second radio signal according to the input signal. The second receiver is supplied with the first supply voltage and the first ground and generates the first control signal according to the first radio signal. The second isolation barrier is configured to electrically isolate the second transmitter from the second receiver.

According to an embodiment of the invention, each of the first power circuit and the second power circuit comprises a pre-driver. The pre-driver generates a first internal signal according to the control signal, wherein the pre-driver is configured to improve driving capability of the control signal, wherein the driving circuit generates the driving voltage according to the first internal signal.

According to an embodiment of the invention, each of the first driving circuit and the second driving circuit comprises a high-side transistor, a low-side transistor, and a charge pump. The high-side transistor provides a supply voltage to a driving node according to a high-side voltage of a high-side node. The low-side transistor couples the driving node to the ground according to a first internal signal. The charge pump is coupled to the high-side node and the driving node, wherein the charge pump is configured to generate a high-side voltage that exceeds the supply voltage according to the first internal signal.

According to an embodiment of the invention, each of the first power circuit and the second power circuit comprises a hysteresis circuit. The hysteresis circuit is coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.

According to an embodiment of the invention, the hysteresis circuit comprises a first resistor, a third normally-off transistor, a fourth normally-off transistor, a fifth normally-off transistor, and a second resistor. The first resistor is coupled between the supply voltage and an output node, wherein the second internal signal is generated at the output node. The third normally-off transistor comprises a gate terminal coupled to a third node, a source terminal coupled to a fourth node, and a drain terminal coupled to the output node. The fourth normally-off transistor comprises a gate terminal coupled to the third node, a source terminal coupled to the ground, and a drain terminal coupled to the fourth node. The fifth normally-off transistor comprises a gate terminal coupled to the output node, a source terminal coupled to the fourth node, and a drain terminal supplied by the supply voltage. The second resistor is coupled to the third node and receives the control signal.

According to an embodiment of the invention, the pre-driver comprises a first sub pre-driver, a second sub pre-driver, a third sub pre-driver, and a fourth sub pre-driver. The first sub pre-driver generates the first internal signal according to a first sub-internal signal. The second sub pre-driver generates the first sub-internal signal according to a second sub-internal signal. The third sub pre-driver generates the second sub-internal signal according to a third internal signal. The fourth sub pre-driver generates the third sub-internal signal according to the second internal signal.

According to an embodiment of the invention, the first sub pre-driver comprises: a first sub normally-off transistor, a second sub normally-off transistor, and a first sub normally-on transistor. The first sub normally-off transistor comprises a gate terminal receiving the first sub-internal signal, a source terminal coupled to the ground, and a drain terminal generating the first internal signal. The second sub normally-off transistor comprises a gate terminal receiving the second sub-internal signal, a source terminal coupled to the drain terminal of the first sub normally-off transistor, and a drain terminal supplied with the supply voltage. The first sub normally-on transistor comprises a gate terminal coupled to the drain terminal of the first sub normally-off transistor, a source terminal coupled to the drain terminal of the first sub normally-off transistor, and a drain terminal supplied with the supply voltage.

According to an embodiment of the invention, the second sub pre-driver comprises: a third sub normally-off transistor, a fourth sub normally-off transistor, and a second sub normally-on transistor. The third sub normally-off transistor comprises a gate terminal receiving the second sub-internal signal, a source terminal coupled to the ground, and a drain terminal generating the first sub-internal signal. The fourth sub normally-off transistor comprises a gate terminal receiving the third sub-internal signal, a source terminal coupled to the drain terminal of the third sub normally-off transistor, and a drain terminal supplied with the supply voltage. The second sub normally-on transistor comprises a gate terminal coupled to the drain terminal of the third sub normally-off transistor, a source terminal coupled to the drain terminal of the third sub normally-off transistor, and a drain terminal supplied with the supply voltage.

According to an embodiment of the invention, the third sub pre-driver comprises: a fifth sub normally-off transistor, a sixth sub normally-off transistor, and a third sub normally-on transistor. The fifth sub normally-off transistor comprises a gate terminal receiving the third sub-internal signal, a source terminal coupled to the ground, and a drain terminal generating the second sub-internal signal. The sixth sub normally-off transistor comprises a gate terminal receiving the second internal signal, a source terminal coupled to the drain terminal of the fifth sub normally-off transistor, and a drain terminal supplied with the supply voltage. The third sub normally-on transistor comprises a gate terminal coupled to the drain terminal of the fifth sub normally-off transistor, a source terminal coupled to the drain terminal of the fifth sub normally-off transistor, and a drain terminal supplied with the supply voltage.

According to an embodiment of the invention, the fourth sub pre-driver comprises: a seventh sub normally-off transistor, an eighth sub normally-off transistor, and a fourth sub normally-on transistor. The seventh sub normally-off transistor comprises a gate terminal receiving the second internal signal, a source terminal coupled to the ground, and a drain terminal generating the third sub-internal signal. The eighth sub normally-off transistor comprises a gate terminal coupled to the third node of the first hysteresis circuit, a source terminal coupled to the drain terminal of the seventh sub normally-off transistor, and a drain terminal supplied with the supply voltage. The fourth sub normally-on transistor comprises a gate terminal coupled to the drain terminal of the seventh sub normally-off transistor, a source terminal coupled to the drain terminal of the seventh sub normally-off transistor, and a drain terminal supplied with the supply voltage.

According to an embodiment of the invention, the high-side transistor and the low-side transistor are normally-off transistors.

According to an embodiment of the invention, the charge pump comprises: a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when a voltage of the second node exceeds a voltage of the high-side node. The third unidirectional conducting device unidirectionally provides the driving voltage to the second node when the driving voltage exceeds the voltage of the second node. The switch receives the control signal and is configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch. When the control signal is at a low voltage level, the switch is turned OFF, the third unidirectional conducting device provides the driving voltage to the second node, and the capacitor is discharged to the high-side node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, each of the first driving circuit and the second driving circuit further comprises: a high-side normally-on transistor. The high-side normally-on transistor comprises a source terminal coupled to the driving node, a gate terminal coupled to the driving node, and a drain terminal supplied with the supply voltage, wherein the high-side normally-on transistor is configured to improve driving capability of the high-side transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
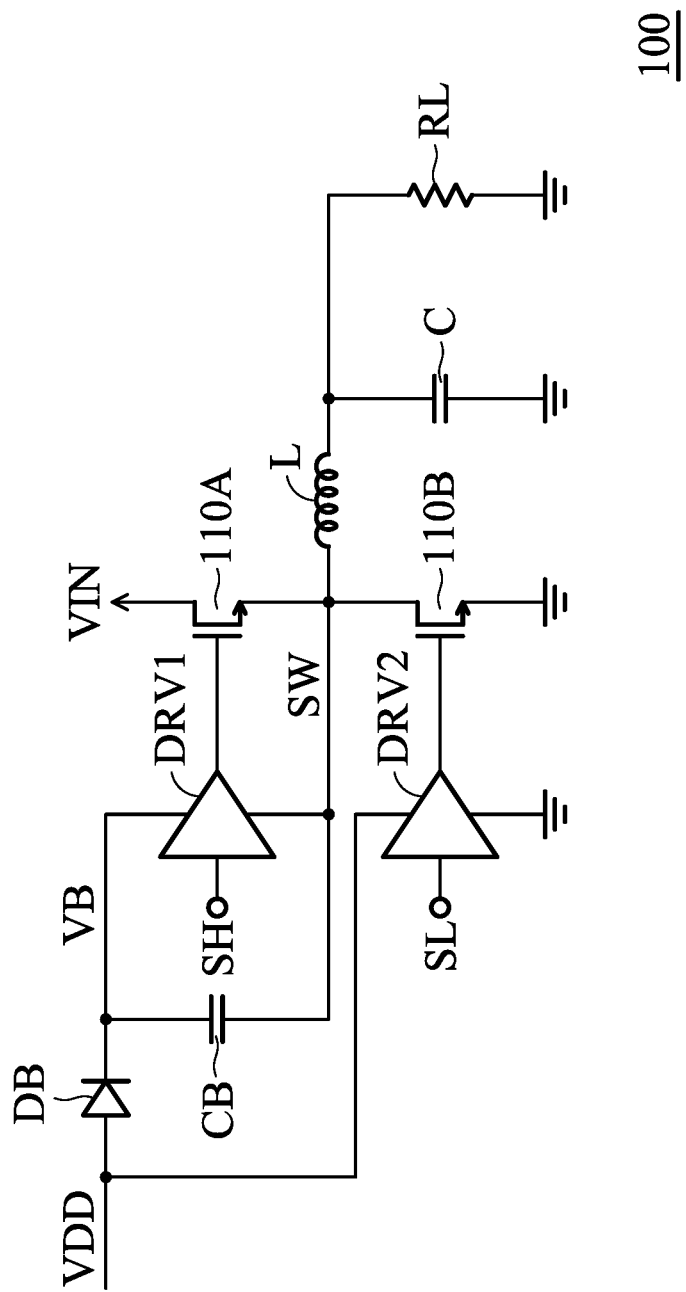
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
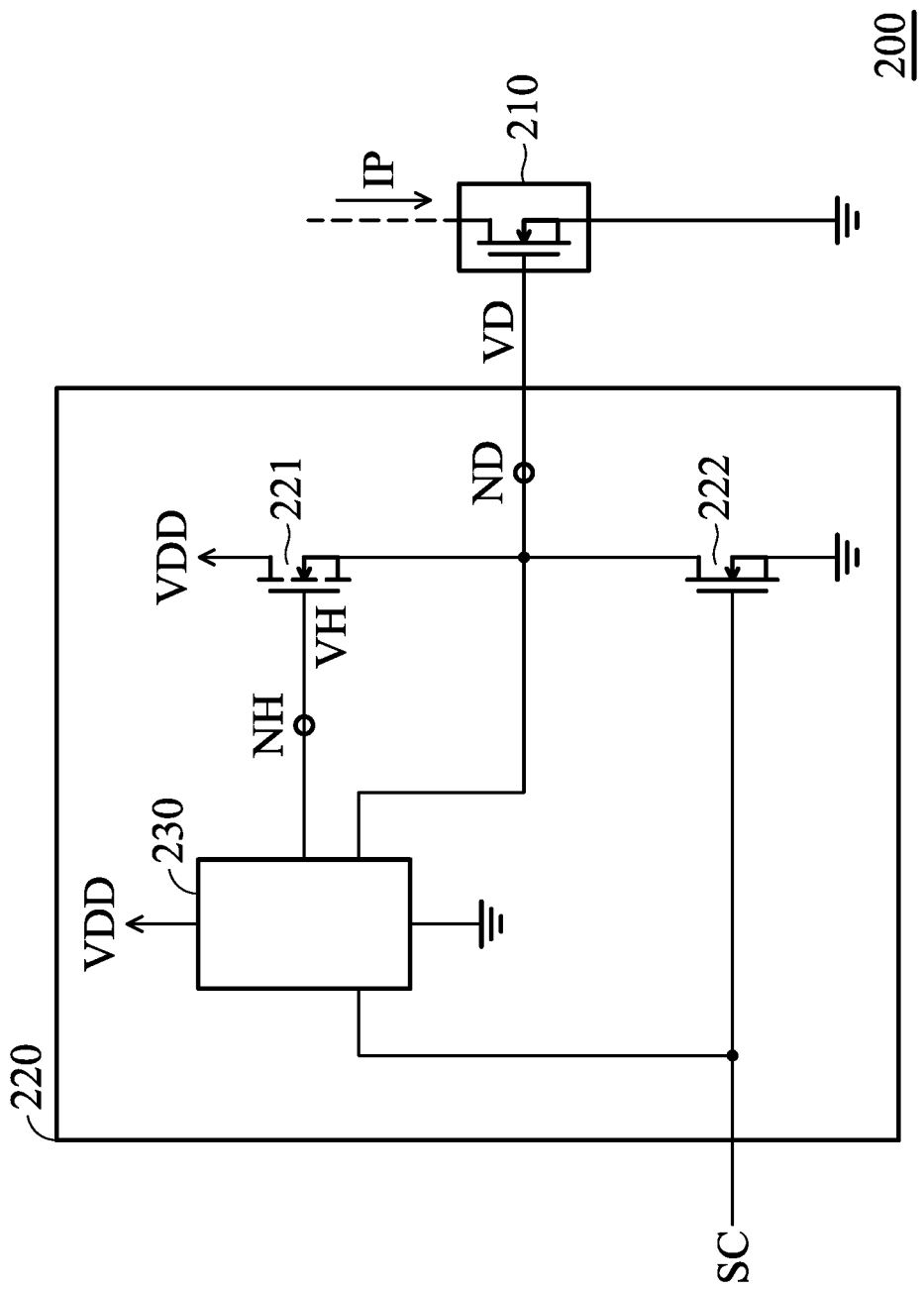
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a driving circuit 220. The power transistor 210 draws the power current IP according to the driving voltage VD of the driving node ND. According to an embodiment of the invention, the power transistor 210 is a GaN transistor.

The driving circuit 220 includes a high-side transistor 221, a low-side transistor 222, and a charge pump 230. The high-side transistor 221 supplies the supply voltage VDD to the driving node ND according to the high-side voltage VH of the high-side node NH. The low-side transistor 222 is coupled between the driving node ND and the ground, and configured to pull the driving voltage VD down to the ground according to the control signal SC. According to an embodiment of the invention, the high-side transistor 221 and the low-side transistor 222 are normally-off transistors.

The charge pump 230 is supplied with the supply voltage VDD and the ground and coupled to the high-side node NH and the driving node ND. For the sake of fully turning on the high-side transistor 221, the charge pump 230 is configured to generate the high-side voltage VH exceeding the supply voltage VDD, so that the gate-to-source voltage of the high-side transistor 221 at least exceeds the threshold voltage to apply the supply voltage VDD to the driving node ND. According to an embodiment of the invention, the driving circuit 220 is a rail-to-rail driver, so that the driving voltage VD ranges from the supply voltage VDD to the ground level.

Figure 3:
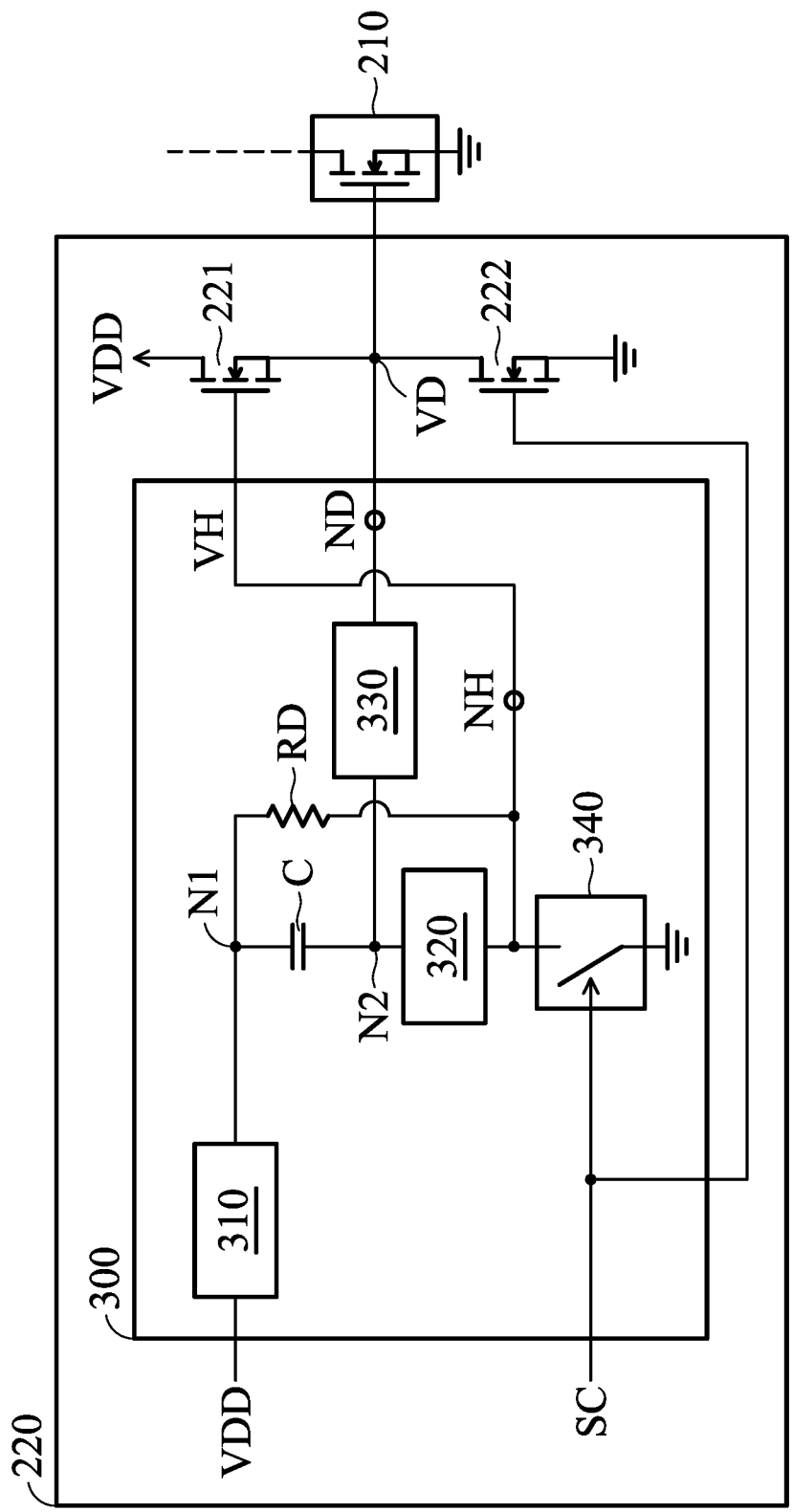
FIG. 3 is a schematic diagram of the charge pump in the power circuit 200 of FIG. 2 in accordance with the invention.

FIG. 3 is a schematic diagram of the charge pump in the power circuit 200 of FIG. 2 in accordance with the invention. As shown in FIG. 3, the charge pump 300, which is coupled to the driving node ND and the high-side node NH, includes a first unidirectional conducting device 310, a discharge resistor RD, a capacitor C, a second unidirectional conducting device 320, a third unidirectional conducting device 330, and a switch 340.

When the supply voltage VDD exceeds the voltage of the first node N1, the first unidirectional conducting device 310 is turned ON. When the voltage VDD does not exceed the voltage of the first node N1, the first unidirectional conducting device 310 is turned OFF. The capacitor C is coupled between the first node N1 and the second node N2. The discharge resistor RD is coupled between the first node N1 and the high-side node NH.

The second unidirectional conducting device 320 is coupled between the second node N2 and the high-side node NH. When the voltage of the second node N2 exceeds the high-side voltage VH, the second unidirectional conducting device 320 is turned ON. When the voltage of the second node N2 does not exceed the high-side voltage VH, the second unidirectional conducting device 320 is turned OFF.

The third unidirectional conducting device 330 is coupled between the driving node ND and the second node N2. When the driving voltage VD of the driving node ND exceeds the voltage of the second node N2, the third unidirectional conducting device 330 is turned ON. When the driving voltage VD does not exceed the voltage of the second node N2, the third unidirectional conducting device 330 is turned OFF.

The switch 340 receives the control signal SC and is coupled between the high-side node NH and the ground. In addition, the switch 340 is configured to couple the high-side node NH to the ground according to the control signal SC.

For the simplicity of illustration, the switch 340 is illustrated herein as an N-type transistor. According to an embodiment of the invention, when the control signal SC is at the high voltage level, such as the supply voltage VDD, the switch 340 is turned ON and the capacitor C is charged by the supply voltage VDD through the first unidirectional conducting device 310, the second unidirectional conducting device 320, and the switch 340 to the ground.

According to another embodiment of the invention, when the control signal SC is at the low voltage level, such as the ground level, the switch 340 is turned OFF and the third unidirectional conducting device 330 provides the driving voltage VD to the second node N2, so that the capacitor C is discharged to the driving node ND through the discharge resistor RD.

According to an embodiment of the invention, the resistance of the discharge resistor RD determines the maximum voltage that the capacitor C can be charged and also the maximum voltage that the high-side voltage VH can be achieved. In addition, the larger the resistance of the discharge resistor RD is, the lower the rising speed of the high-side voltage VD could be achieved. Therefore, there is a trade-off on the resistance of the discharge resistor RD.

According to an embodiment of the invention, each of the first unidirectional conducting device 310, the second unidirectional conducting device 320, and the third unidirectional conducting device 330 is a diode. According to another embodiment of the invention, each of the first unidirectional conducting device 310, the second unidirectional conducting device 320, and the third unidirectional conducting device 330 is a diode-connected normally-off transistor.

Figure 4:
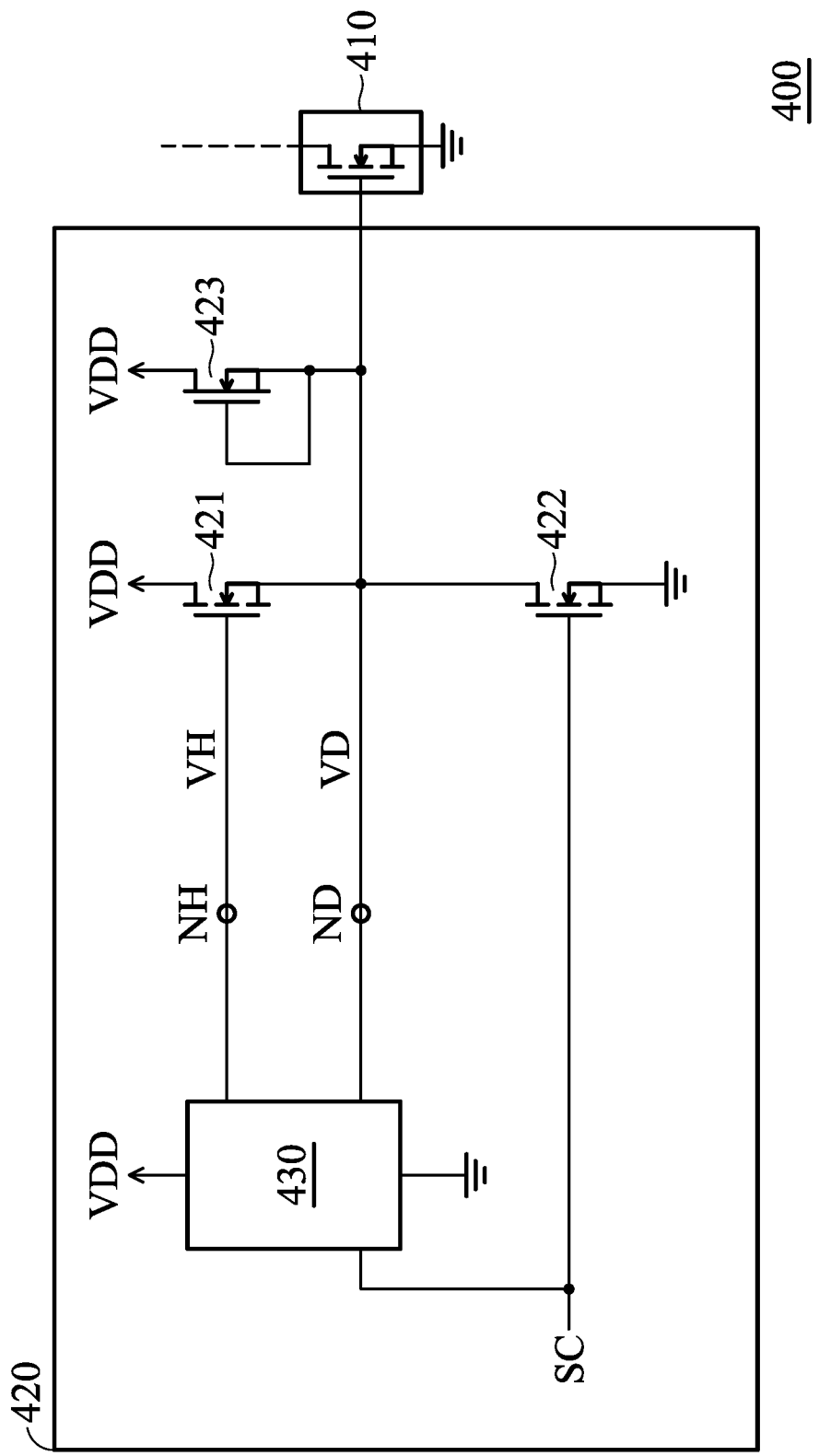
FIG. 4 is a block diagram of a power circuit in accordance with another embodiment of the invention.

FIG. 4 is a block diagram of a power circuit in accordance with another embodiment of the invention. As shown in FIG. 4, the power circuit 400 includes a power transistor 410 and a driving circuit 420, in which the power transistor 410 and the driving circuit 420 respectively correspond to the power transistor 210 and the driving circuit 220 in FIG. 2.

The driving circuit 420 further includes a high-side normally-on transistor 423. The source terminal and the gate terminal of the high-side normally-on transistor 423 are coupled to the driving node ND, and the drain terminal of the high-side normally-on transistor 423 is supplied with the supply voltage VDD. The high-side normally-on transistor 423 is always turned on to improve the driving capability of the high-side transistor 221.

Figure 5:
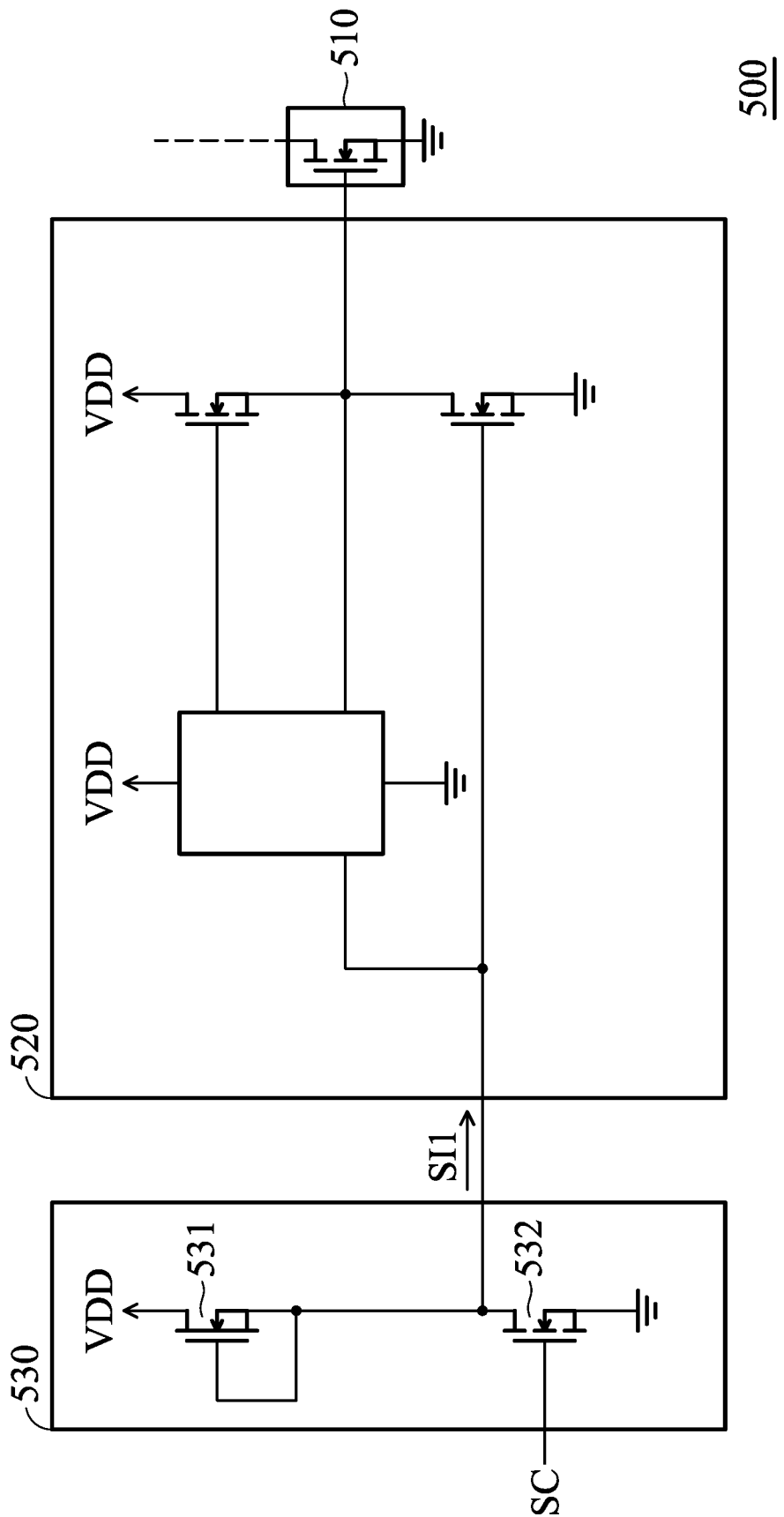
FIG. 5 is a block diagram of a power circuit in accordance with yet another embodiment of the invention.

FIG. 5 is a block diagram of a power circuit in accordance with yet another embodiment of the invention. As shown in FIG. 5, the power circuit 500 includes a power transistor 510, a driving circuit 520, and a first pre-driver 530, in which the power transistor 510 and the driving circuit 520 respectively correspond to the power transistor 210 and the driving circuit 220 in FIG. 2.

The first pre-driver 530 receives the control signal SC to generate the first internal signal SI1 to the driving circuit 520 for improving the driving capability of the control signal SC. The first pre-driver 530 includes a first normally-on transistor 531 and a first normally-off transistor 532.

The gate terminal and the source terminal of the first normally-on transistor 531 are coupled to the driving circuit 520, and the drain terminal of the first normally-on transistor 531 is supplied with the supply voltage VDD. The gate terminal of first normally-off transistor 532 receives the control signal SC, the source terminal of first normally-off transistor 532 is coupled to the ground, and the drain terminal of first normally-off transistor 532 is coupled to the driving circuit 520.

Figure 6:
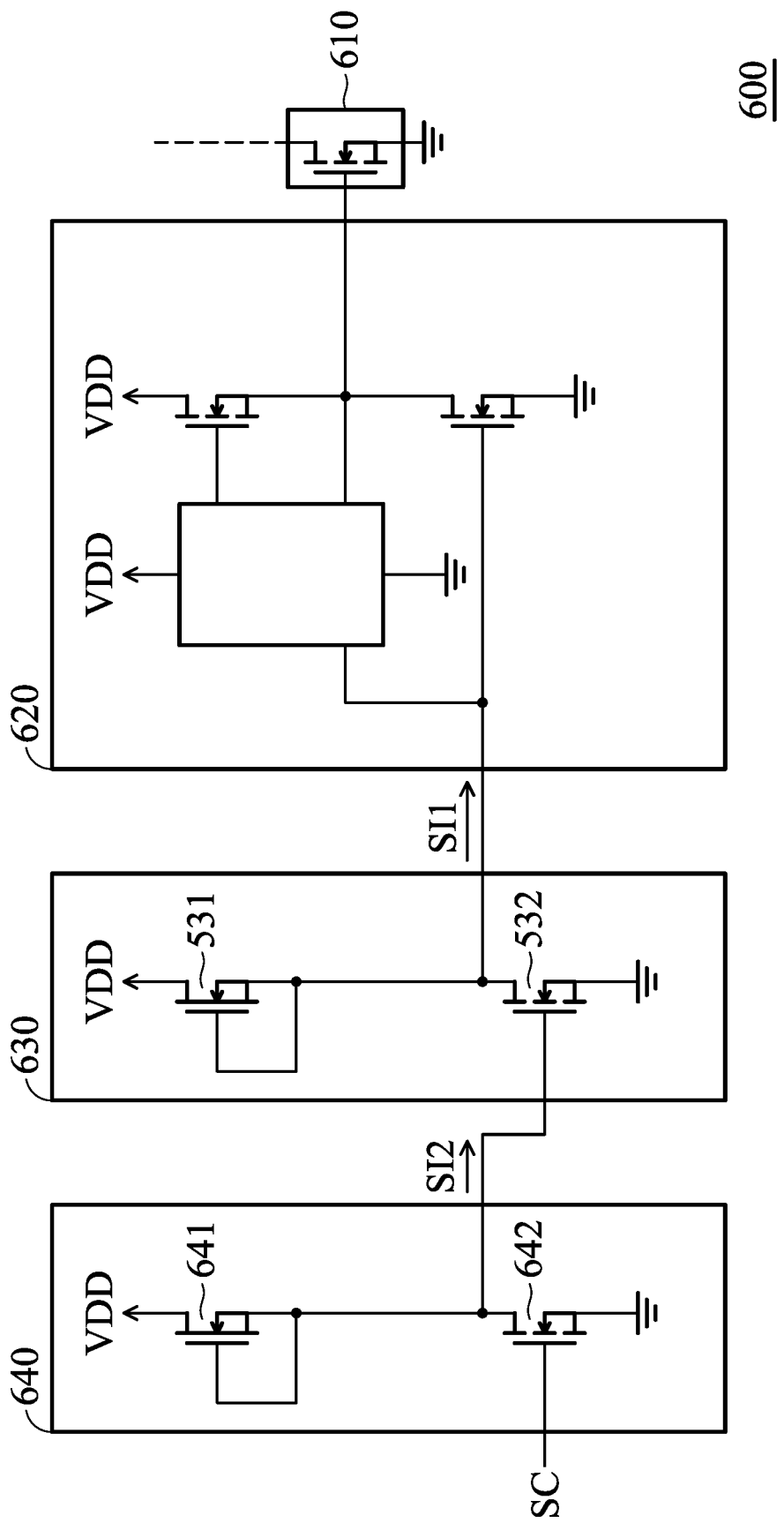
FIG. 6 is a block diagram of a power circuit in accordance with yet another embodiment of the invention.

FIG. 6 is a block diagram of a power circuit in accordance with yet another embodiment of the invention. As shown in FIG. 6, the power circuit 600 includes a power transistor 610, a driving circuit 620, a first pre-driver 630, and a second pre-driver 640, in which the power transistor 610, the driving circuit 620, and the first pre-driver 630 respectively correspond to the power transistor 510, the driving circuit 520, and the first pre-driver 530 in FIG. 5.

The second pre-driver 640 receives the control signal SC to generate the second internal signal SI2 to the first pre-driver 630 for further improving the driving capability of the control signal SC. The second pre-driver 640 includes a second normally-on transistor 641 and a second normally-off transistor 642.

The gate terminal and the source terminal of the second normally-on transistor 641 are coupled to the gate terminal of the first normally-off transistor 532 in the first pre-driver 630, and the drain terminal of the second normally-on transistor 641 is supplied with the supply voltage VDD. The gate terminal of the second normally-off transistor 642 receives the control signal SC, the source terminal of the second normally-off transistor 642 is coupled to the ground, and the drain terminal is coupled to the gate terminal of the first normally-off transistor 532 in the first pre-driver 630.

Figure 7:
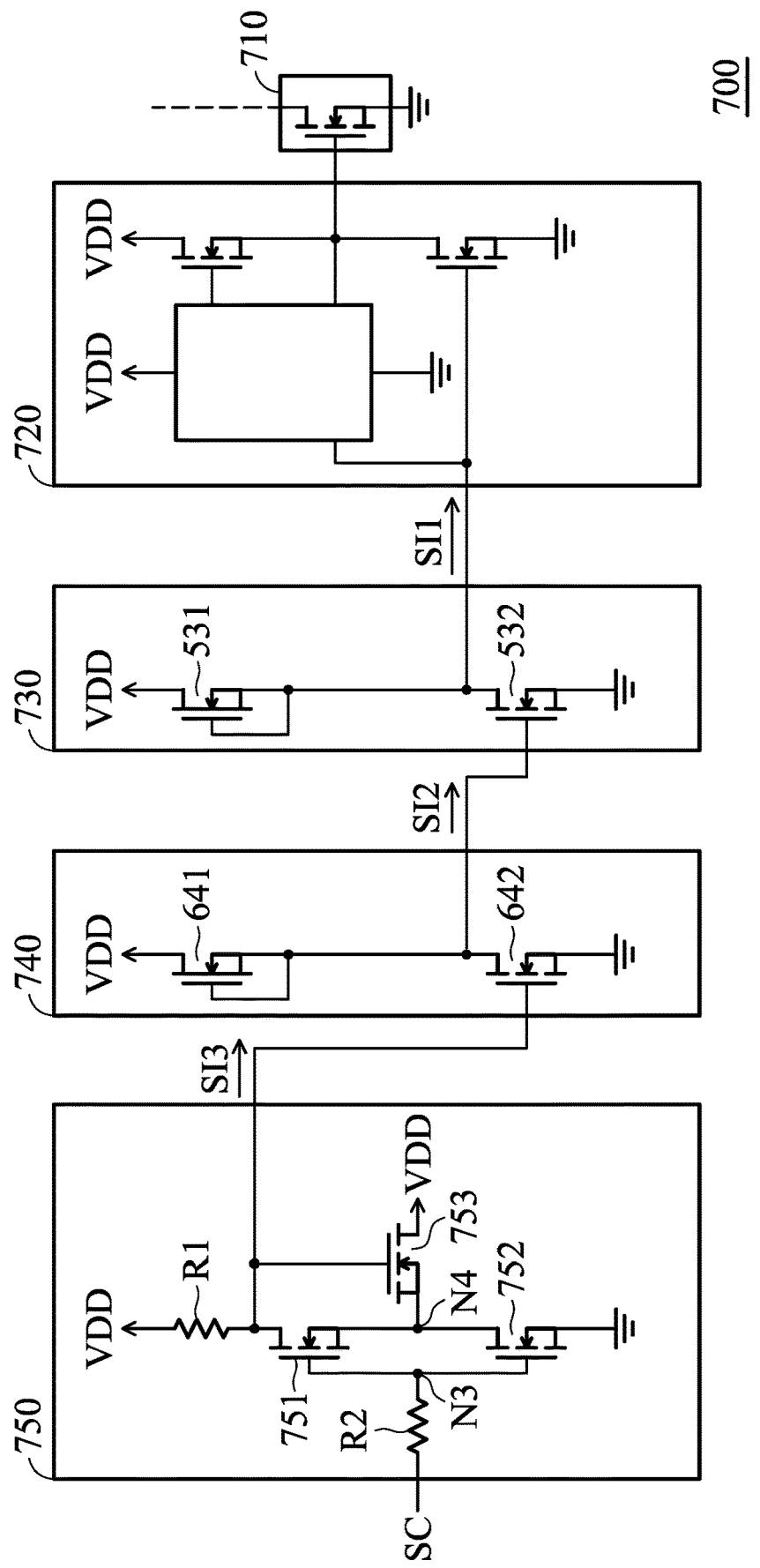
FIG. 7 is a block diagram of a power circuit in accordance with yet another embodiment of the invention.

FIG. 7 is a block diagram of a power circuit in accordance with yet another embodiment of the invention. As shown in FIG. 7, the power circuit 700 includes a power transistor 710, a driving circuit 720, a first pre-driver 730, a second pre-driver 740, and a first hysteresis circuit 750, in which the power transistor 710, the driving circuit 720, the first pre-driver 730, and the second pre-driver 740 respectively correspond to the power transistor 610, the driving circuit 620, the first pre-driver 630, and the second pre-driver 640 in FIG. 6.

The first hysteresis circuit 750 receives the control signal SC to generate the third internal signal SI3 to the second pre-driver 740 for further providing a hysteresis for the control signal SC. The first hysteresis circuit 750 includes a first resistor R1, a third normally-off transistor 751, a fourth normally-off transistor 752, a fifth normally-off transistor 753, and a second resistor R2.

The first resistor R1 is coupled between the supply voltage VDD and the gate terminal of the second normally-off transistor 642 in the second pre-driver 740. The gate terminal of the third normally-off transistor 751 is coupled to a third node N3, the source terminal of the third normally-off transistor 751 is coupled to the fourth node N4, and the drain terminal of the third normally-off transistor 751 is coupled to the first resistor R1 and the gate terminal of the second normally-off transistor 642 in the second pre-driver 740. The gate terminal of the fourth normally-off transistor 752 is coupled to the third node N3, the source terminal of the fourth normally-off transistor 752 is coupled to the ground, and the drain terminal of the fourth normally-off transistor 752 is coupled to the fourth node N4.

The gate terminal of the fifth normally-off transistor 753 is coupled to the first resistor R1 and the gate terminal of the second normally-off transistor 642 in the second pre-driver 740, the source terminal of the fifth normally-off transistor 753 is coupled to the fourth node N4, and the drain terminal of the fifth normally-off transistor 753 is supplied with the supply voltage VDD. The second resistor R2 is coupled to the third node and receives the control signal SC.

Figure 8:
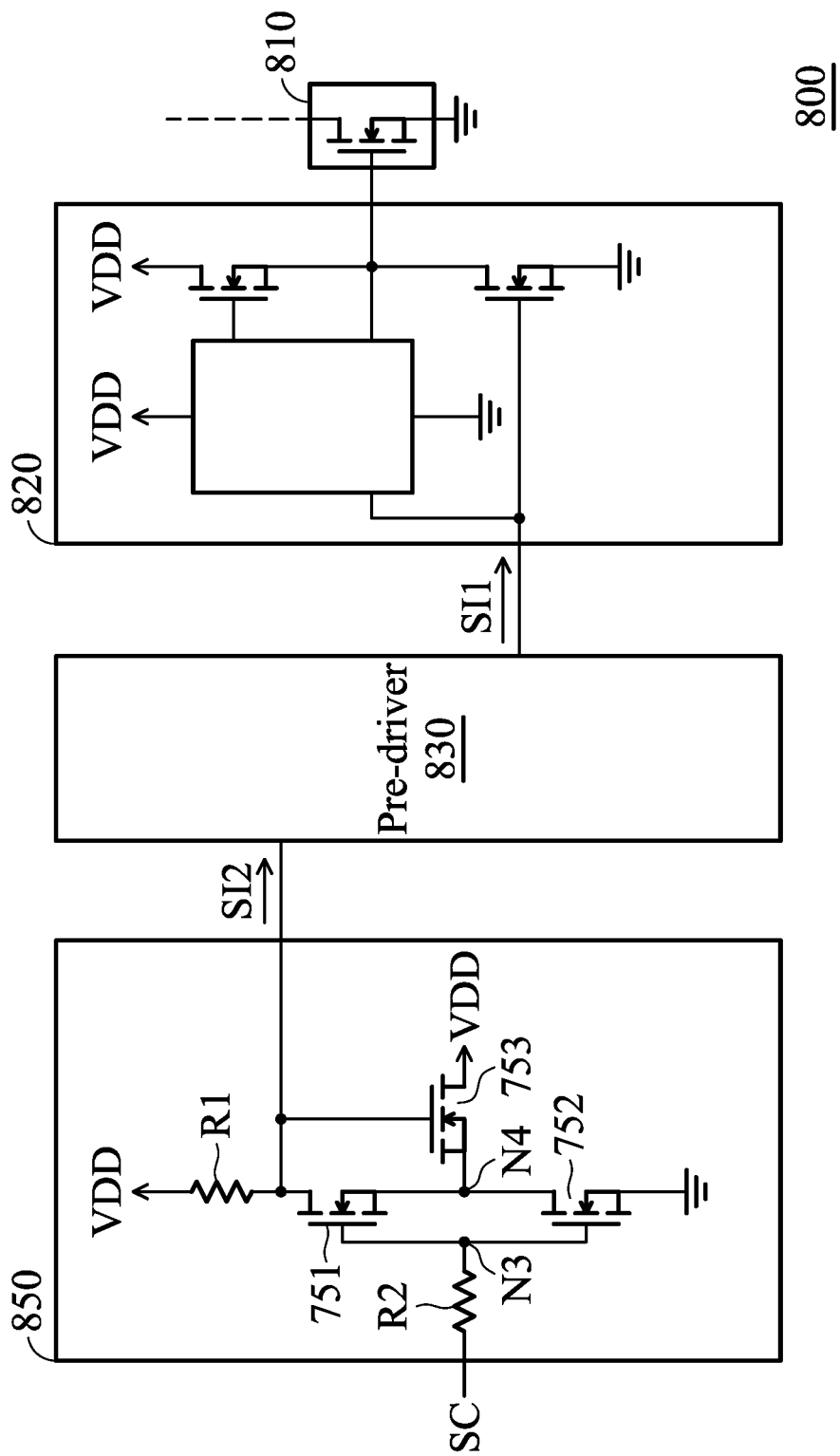
FIG. 8 is a block diagram of a power circuit in accordance with yet another embodiment of the invention.

FIG. 8 is a block diagram of a power circuit in accordance with yet another embodiment of the invention. As shown in FIG. 8, the power circuit 800 includes a power transistor 810, a driving circuit 820, a pre-driver 830, and a first hysteresis circuit 850, in which the power transistor 810, the driving circuit 820, and the first hysteresis circuit 850 respectively correspond to the power transistor 710, the driving circuit 720, and the first hysteresis circuit 750 in FIG. 7.

According to an embodiment of the invention, the pre-driver 830 generates the first internal signal SI1 according to the second internal signal SI2 for improving the driving capability of the control signal SC. According to an embodiment of the invention, the first internal signal SI1 and the second internal signal SI2 are in-phase.

Figure 9:
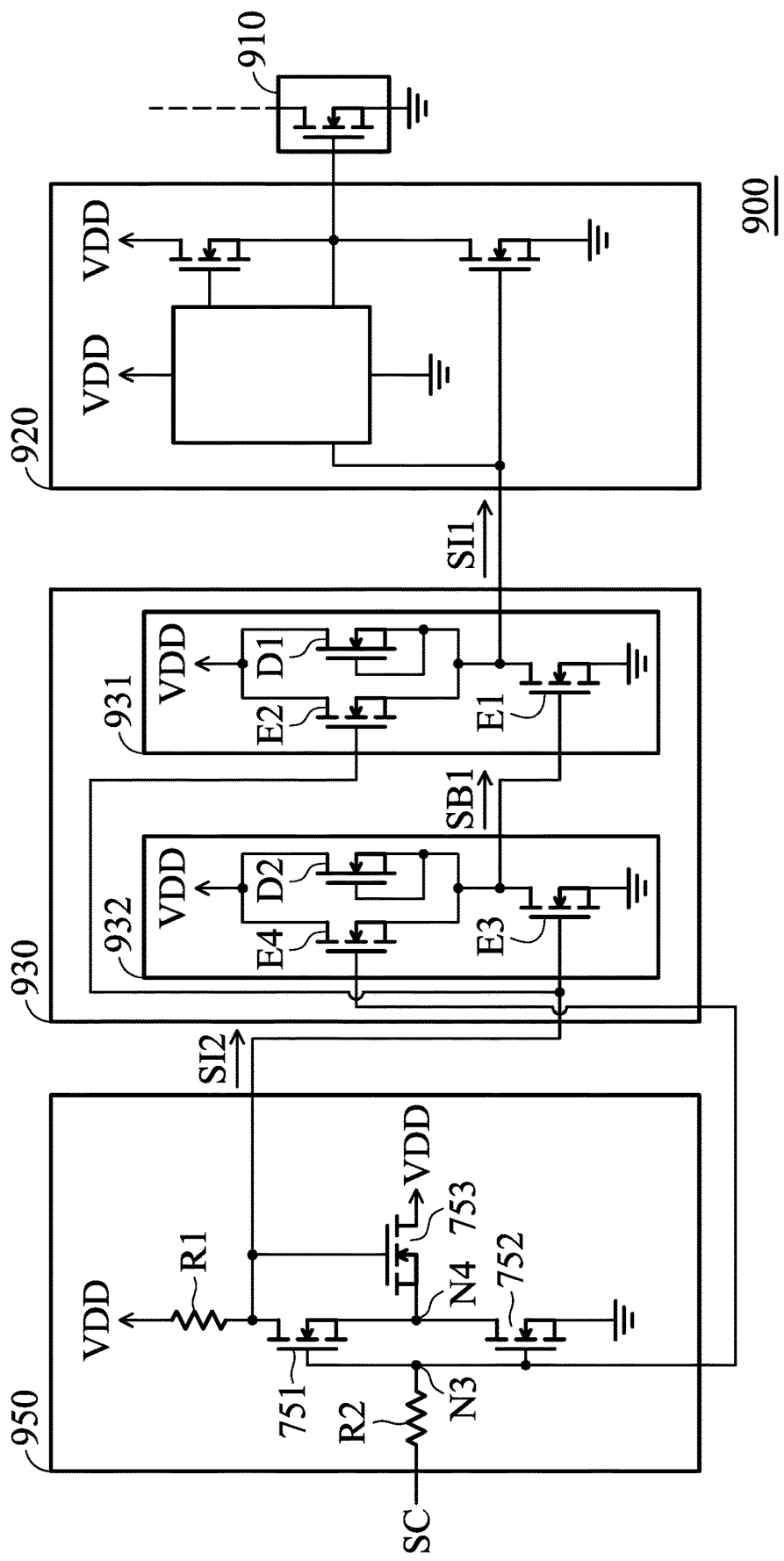
FIG. 9 is a block diagram of a power circuit in accordance with yet another embodiment of the invention.

FIG. 9 is a block diagram of a power circuit in accordance with yet another embodiment of the invention. As shown in FIG. 9, the power circuit 900 includes a power transistor 910, a driving circuit 920, a pre-driver 930, and a first hysteresis circuit 950, in which the power transistor 910, the driving circuit 920, the pre-driver 930, and the first hysteresis circuit 950 respectively correspond to the power transistor 810, the driving circuit 820, the pre-driver 830, and the first hysteresis circuit 850 in FIG. 8.

As shown in FIG. 9, the pre-driver 930 includes a first sub pre-driver 931 and a second sub pre-driver 932. The first sub pre-driver 931 includes a first sub normally-off transistor E1, a second sub normally-off transistor E2, and a first sub normally-on transistor D1, in which the first sub pre-driver 931 generates the first internal signal SI1 according to a first sub-internal signal SB1.

The gate terminal of the first sub normally-off transistor E1 receives the first sub-internal signal SB1, and the source terminal of the first sub normally-off transistor E1 is coupled to the ground. The gate terminal of the second sub normally-off transistor E2 receives the second internal signal SI2. Namely, the gate terminal of the second sub normally-off transistor E2 is coupled to the gate terminal of the third sub normally-on transistor E3. The drain terminal of the second sub normally-off transistor E2 is supplied with the supply voltage VDD.

The source terminal of the second sub normally-off transistor E2 is coupled to the drain terminal of the first sub normally-off transistor E1, in which the drain terminal of the first sub normally-off transistor E1 generates the first internal signal SI1 to the driving circuit 920. The gate and source terminals of the first sub normally-on transistor D1 are coupled together. The drain terminal of the first sub normally-on transistor D1 is supplied with the supply voltage VDD.

The second sub pre-driver 932 includes a third sub normally-off transistor E3, a fourth sub normally-off transistor E4, and a second sub normally-on transistor D2, in which the second sub pre-driver 932 generates the first sub-internal signal SB1 according to the second internal signal SI2.

The gate terminal of the third sub normally-off transistor E3 receives the second internal signal SI2, and the source terminal of the third sub normally-off transistor E3 is coupled to the ground. The gate terminal of the fourth sub normally-off transistor E4 is coupled to the third node N3 in the first hysteresis circuit 950. The drain terminal of the fourth sub normally-off transistor E4 is supplied with the supply voltage VDD.

The source terminal of the fourth sub normally-off transistor E4 is coupled to the drain terminal of the third sub normally-off transistor E3, in which the drain terminal of the third sub normally-off transistor E3 generates the first sub-internal signal SB1 to the first sub pre-driver 931. The gate and source terminals of the second sub normally-on transistor D2 are coupled together. The drain terminal of the second sub normally-on transistor D2 is supplied with the supply voltage VDD.

Figure 10:
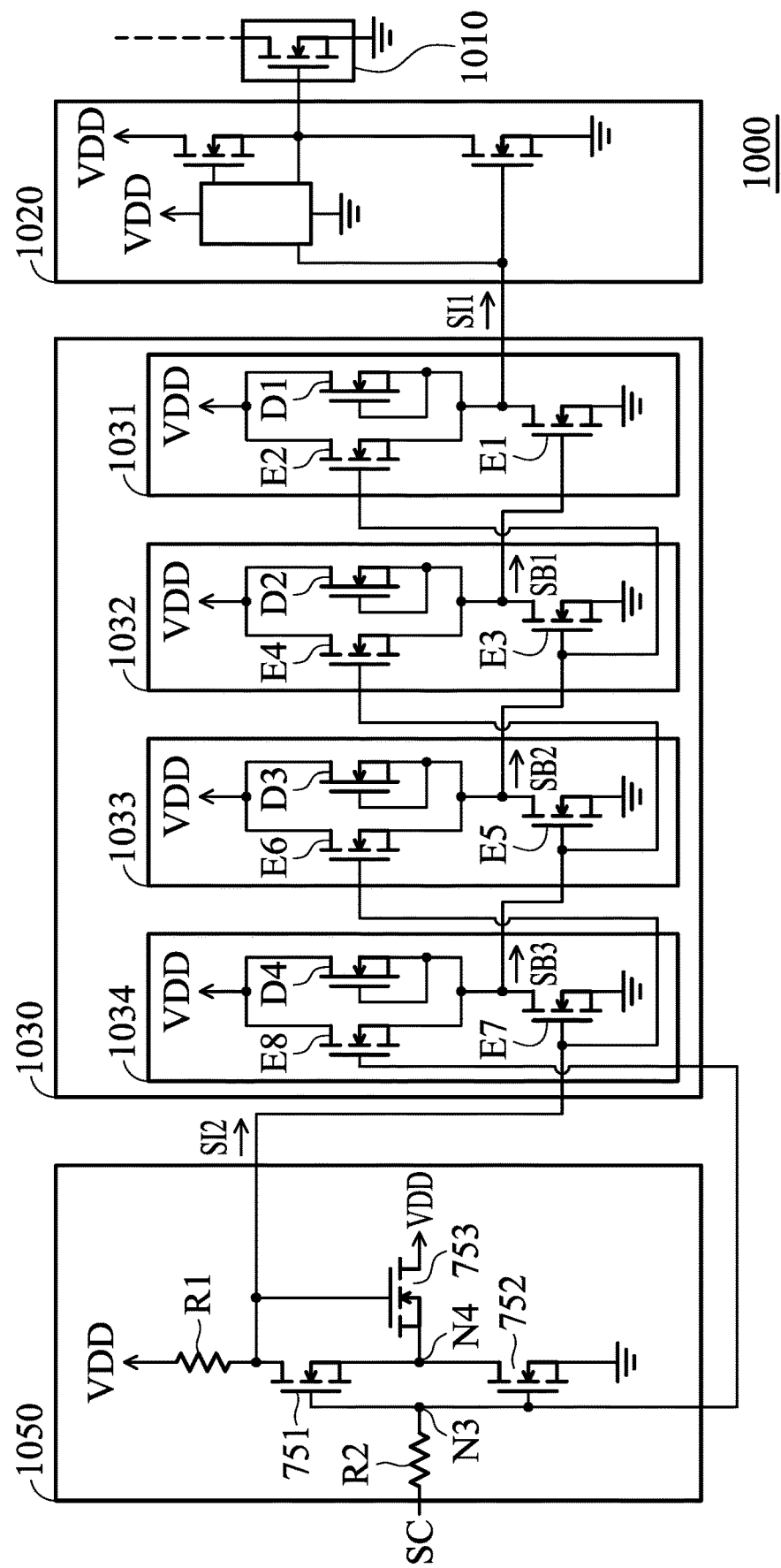
FIG. 10 is a block diagram of a power circuit in accordance with yet another embodiment of the invention.

FIG. 10 is a block diagram of a power circuit in accordance with yet another embodiment of the invention. As shown in FIG. 10, the power circuit 1000 includes a power transistor 1010, a driving circuit 1020, a pre-driver 1030, and a first hysteresis circuit 1050, in which the power transistor 1010, the driving circuit 1020, the pre-driver 1030, and the first hysteresis circuit 1050 respectively correspond to the power transistor 910, the driving circuit 920, the pre-driver 930, and the first hysteresis circuit 950 in FIG. 9.

As shown in FIG. 10, the pre-driver 1030 includes a first sub pre-driver 1031, a second sub pre-driver 1032, a third sub pre-driver 1033, and a fourth sub pre-driver 1034, in which the first sub pre-driver 1031 and the second sub pre-driver 1032 respectively correspond to the first sub pre-driver 931 and the second sub pre-driver 932 in FIG. 9, which are not repeated herein.

The second sub pre-driver 1032 includes a third sub normally-off transistor E3, a fourth sub normally-off transistor E4, and a second sub normally-on transistor D2, in which the second sub pre-driver 1032 generates the first sub-internal signal SB1 according to the second sub-internal signal SB2.

The gate terminal of the third sub normally-off transistor E3 receives the second sub-internal signal SB2, and the source terminal of the third sub normally-off transistor E3 is coupled to the ground. The gate terminal of the fourth sub normally-off transistor E4 receives the third sub-internal signal SB3. The drain terminal of the fourth sub normally-off transistor E4 is supplied with the supply voltage VDD.

The source terminal of the fourth sub normally-off transistor E4 is coupled to the drain terminal of the third sub normally-off transistor E3, in which the drain terminal of the third sub normally-off transistor E3 generates the second sub-internal signal SB2 to the first sub pre-driver 1031. The gate terminal and the source terminal of the second sub normally-on transistor D2 are coupled together. The drain terminal of the second sub normally-on transistor D2 is supplied with the supply voltage VDD.

The third sub pre-driver 1033 includes a fifth sub normally-off transistor E5, a sixth sub normally-off transistor E6, and a third sub normally-on transistor D3, in which the third sub pre-driver 1033 generates the second sub-internal signal SB2 according to the third sub-internal signal SB3.

The gate terminal of the fifth sub normally-off transistor E5 receives the third sub-internal signal SB3, and the source terminal of the fifth sub normally-off transistor E5 is coupled to the ground. The gate terminal of the sixth sub normally-off transistor E6 receives the second internal signal SI2. The drain terminal of the sixth sub normally-off transistor E6 is supplied with the supply voltage VDD.

The source terminal of the sixth sub normally-off transistor E6 is coupled to the drain terminal of the fifth sub normally-off transistor E5, in which the drain terminal of the fifth sub normally-off transistor E5 generates the second sub-internal signal SB2 to the second sub pre-driver 1032. The gate and source terminals of the third sub normally-on transistor D3 are coupled together. The drain terminal of the third sub normally-on transistor D3 is supplied with the supply voltage VDD.

The fourth sub pre-driver 1034 includes a seventh sub normally-off transistor E7, an eighth sub normally-off transistor E8, and a fourth sub normally-on transistor D4, in which the fourth sub pre-driver 1034 generates the third sub-internal signal SB3 according to the second internal signal SI2.

The gate terminal of the seventh sub normally-off transistor E7 receives the second internal signal SI2, the source terminal of the seventh sub normally-off transistor E7 is coupled to the ground. The gate terminal of the eighth sub normally-off transistor E8 is coupled to the third node N3 in the first hysteresis circuit 1050. The drain terminal of the eighth sub normally-off transistor E8 is supplied with the supply voltage VDD.

The source terminal of the eighth sub normally-off transistor E8 is coupled to the drain terminal of the seventh sub normally-off transistor E7, in which the drain terminal of the seventh sub normally-off transistor E7 generates the third sub-internal signal SB3 to the third sub pre-driver 1033. The gate and source terminals of the fourth sub normally-on transistor D4 are coupled together. The drain terminal of the fourth sub normally-on transistor D4 is supplied with the supply voltage VDD.

According to other embodiments of the invention, the pre-driver 830 in FIG. 8 may include an even number of the sub pre-drivers such that the first internal signal SI1 and the second internal signal SI2 are in-phase.

Figure 11:
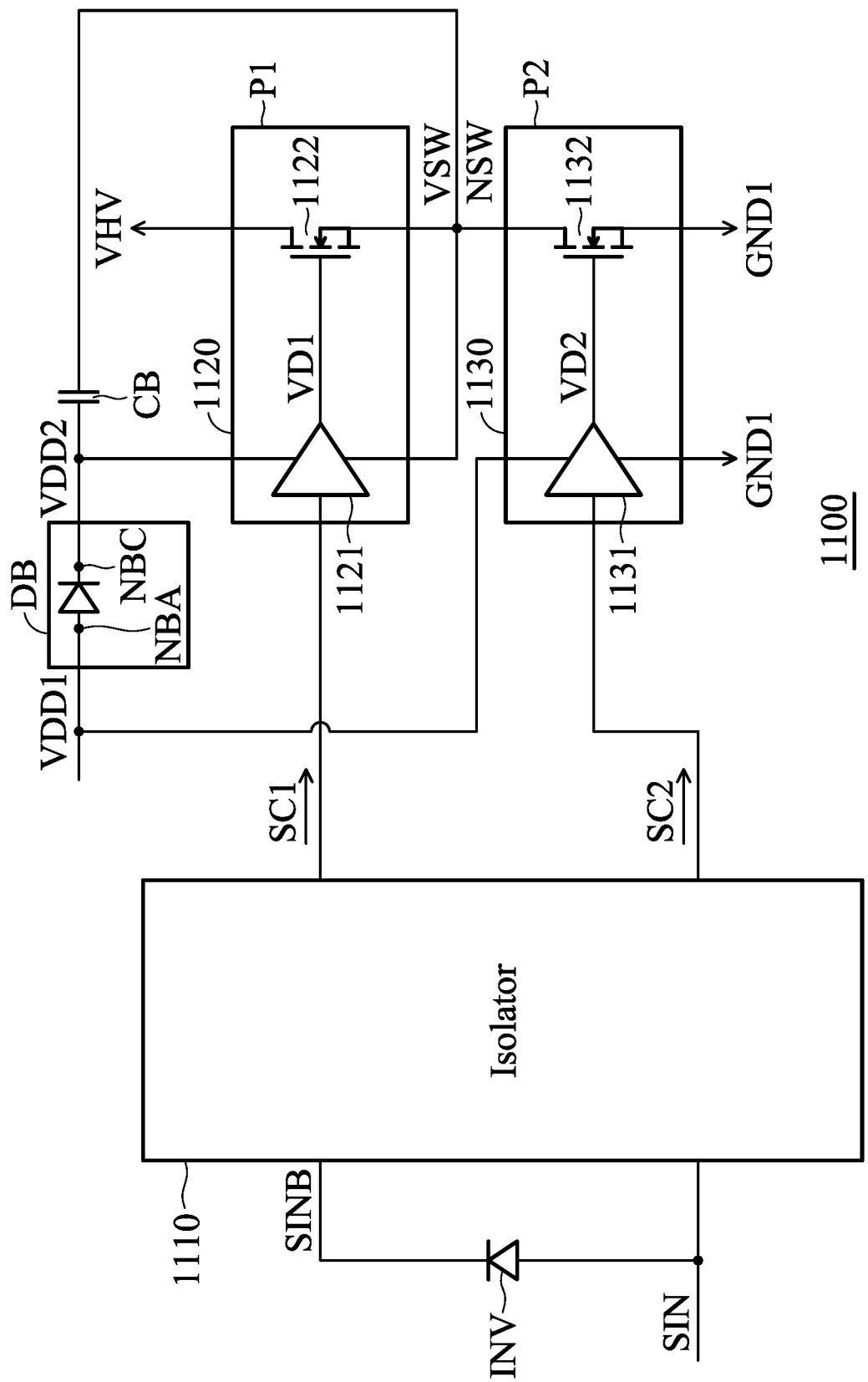
FIG. 11 is a block diagram of an integrated circuit in accordance with an embodiment of the invention.

FIG. 11 is a block diagram of an integrated circuit in accordance with an embodiment of the invention. As shown in FIG. 11, the integrated circuit 1100 includes a isolator 1110, a first power circuit 1120, a second power circuit 1130, a bootstrap diode DB, and a bootstrap capacitor CB.

The isolator 1110 generates a first control signal SC1 and a second control signal SC2 according to an input signal SIN. According to some embodiments of the invention, the input signal SIN may be generated externally. As illustrated in FIG. 11, a reverse input signal SINB is generated by the inverter INV. The isolator 1110 generates the first control signal SC1 based on the reverse input signal SINB and generates the second control signal SC2 based on the input signal SIN. According to other embodiments of the invention, the reverse input signal SINB and the input signal SIN may be generated externally.

The first power circuit 1120 includes a first driving circuit 1121 and a first power transistor 1122, and the second power circuit 1130 includes a second driving circuit 1131 and a second power transistor 1132. According to an embodiment of the invention, the first driving circuit 1121 is identical to the second driving circuit 1131, and the first power transistor 1122 is identical to the second power transistor 1132.

According to an embodiment of the invention, each of the first driving circuit 1121 and the second driving circuit 1131 may correspond to either one of the driving circuit 220 in FIGS. 2 and 3, the driving circuit 420 in FIG. 4, a combination of the driving circuit 520 and the first pre-driver 530 in FIG. 5, a combination of the driving circuit 620, the first pre-driver 630, and the second pre-driver 640 in FIG. 6, a combination of the driving circuit 720, the first pre-driver 730, the second pre-driver 740, and the first hysteresis circuit 750 in FIG. 7, a combination of the driving circuit 820, the pre-driver, and the first hysteresis circuit 850 in FIG. 8, a combination of the driving circuit 920, the pre-driver 930, and the first hysteresis circuit 950 in FIG. 9, and a combination of the driving circuit 1020, the pre-driver 1030, and the first hysteresis circuit 1050 in FIG. 10.

According to an embodiment of the invention, each of the first power transistor 1122 and the second power transistor 1132 may correspond to either one of the power transistor 210 in FIG. 2, the power transistor 410 in FIG. 4, the power transistor 510 in FIG. 5, the power transistor 610 in FIG. 6, the power transistor 710 in FIG. 7, the power transistor 810 in FIG. 8, the power transistor 910 in FIG. 9, and the power transistor 1010 in FIG. 10.

As shown in FIG. 11, the bootstrap diode DB includes a bootstrap anode NBA and a bootstrap cathode NBC, in which the bootstrap anode NBA is coupled to the first supply voltage VDD1 and the bootstrap cathode NBC is coupled to the second supply voltage VDD2. The bootstrap capacitor CB is coupled between the second supply voltage VDD2 and a switch node NSW. According to an embodiment of the invention, the bootstrap diode DB and the bootstrap capacitor CB are configured to boost the first supply voltage VDD1 into the second supply voltage VDD2 based on the switch voltage VSW of the switch node NSW.

The first driving circuit 1121 is supplied by the second supply voltage VDD2 and the switch voltage VSW, and generates the first driving voltage VD1 according to the first control signal SC1. The first power transistor 1122 provides the high voltage VHV to the switch node NSW according to the first driving node VD1.

The second driving circuit 1131 is supplied by the first supply voltage VDD1 and a first ground GND1, and generates the second driving voltage VD2 according to the second control signal SC2. The second power transistor 1132 couples the switch node NSW to the first ground GND1 according to the second driving voltage VD2.

According to an embodiment of the invention, when the first power transistor 1122 is turned OFF and the second power transistor 1132 is turned ON, the switch voltage VSW is coupled to the first ground GND1 and the second supply voltage VDD2 is equal to the first supply voltage VDD1 minus a forward voltage of the bootstrap diode DB.

According to another embodiment of the invention, when the first power transistor 1122 is turned ON and the second power transistor 1132 is turned OFF, the switch voltage VSW is equal to the high voltage VHV such that the second supply voltage VDD2 is boosted into a voltage of the sum of the high voltage VHV and the first supply voltage VDD1 in order to fully turn ON the first power transistor 1122.

Figure 12:
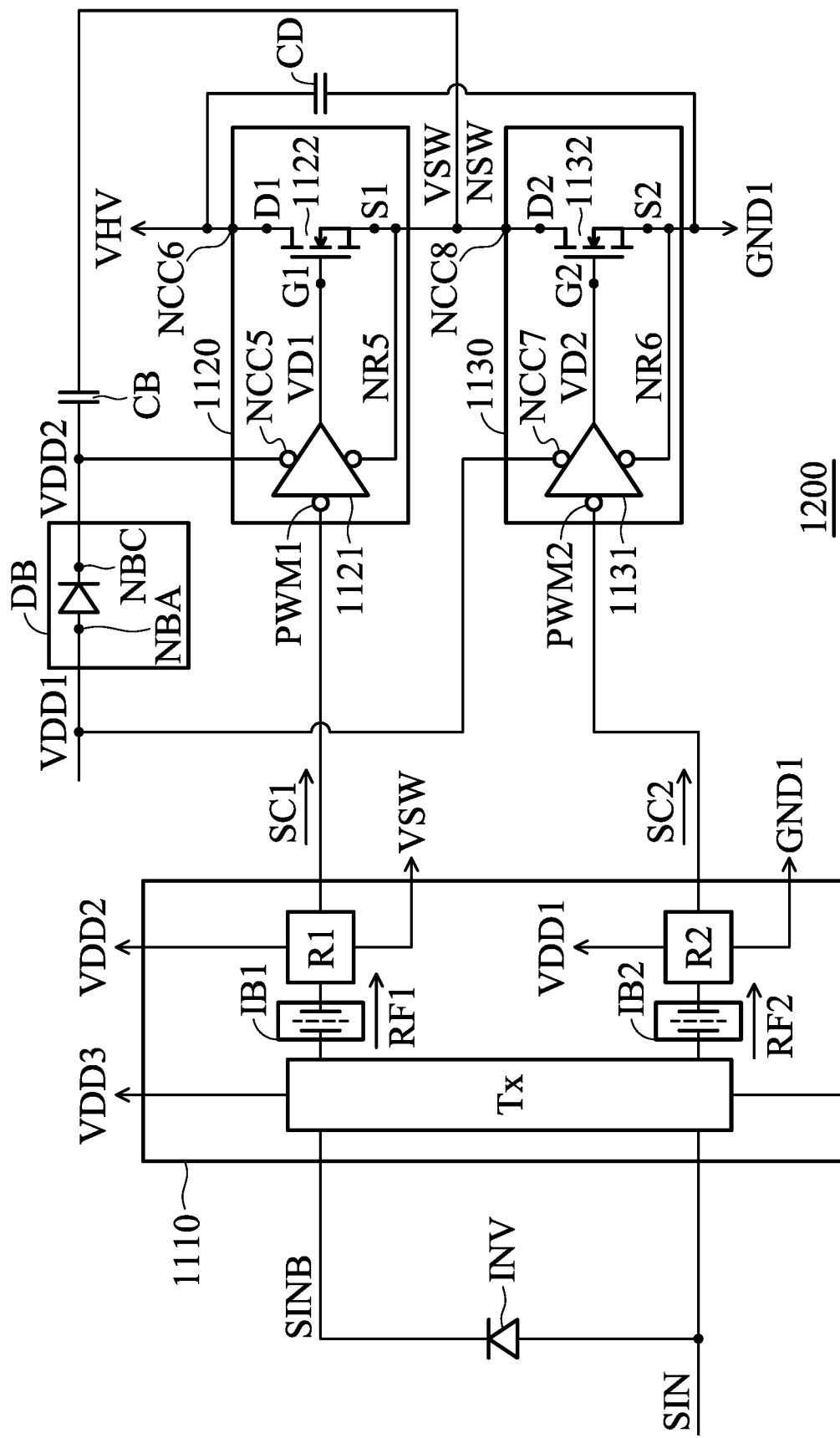
FIG. 12 is a block diagram of an integrated circuit in accordance with another embodiment of the invention.

FIG. 12 is a block diagram of an integrated circuit in accordance with another embodiment of the invention. As shown in FIG. 12, the integrated circuit 1200 includes a isolator 1110, a first power circuit 1120, a second power circuit 1130, a bootstrap diode DB, and a bootstrap capacitor CB, in which the isolator 1110 includes a transmitter TX, a first receiver R1, a first isolation barrier IB1, a second receiver R2, and a second barrier IB2.

The transmitter TX, which is supplied by a third supply voltage VDD3 and a second ground GND2, modulates the input signal SIN to generate a first radio signal RF1 across the first isolation barrier IB1, and modulates the reverse input signal SINB to generate a second radio signal RF2 across the second isolation barrier IB2.

The first receiver R1, which is supplied by the second supply voltage VDD2 and the switch voltage VSW, demodulates the first radio signal RF1 to generate the first control signal SC1. The first isolation barrier D31 is configured to electrically isolate the transmitter TX from the first receiver R1.

The second receiver R2, which is supplied by the first supply voltage VDD1 and the first ground GND1, demodulates the second radio signal RF2 to generate the second control signal SC2. The second isolation barrier D32 is configured to electrically isolate the transmitter TX from the second receiver R2.

According to an embodiment of the invention, the first ground GND1 may be identical to the second ground GND2. According to another embodiment of the invention, the first ground GND1 may not be identical to the second ground GND2. According to an embodiment of the invention, the high voltage VHV exceeds the first supply voltage VDD1, the second supply voltage VDD2, and the third supply voltage VDD3.

According to an embodiment of the invention, the first supply voltage VDD1 may be identical to the third supply voltage VDD3. According to another embodiment of the invention, the first supply voltage VDD1 may not be identical to the third supply voltage VDD3.

As shown in FIG. 12, the integrated circuit 1200 further includes a decoupling capacitor CD. The decoupling capacitor CD is coupled between the high voltage VHV and the first ground GND1. According to an embodiment of the invention, the isolator 1110, the first power circuit 1120, the second power circuit 1130, and the decoupling capacitor CD are packaged together. According to another embodiment of the invention, the isolator 1110, the first power circuit 1120, the second power circuit 1130, the bootstrap capacitor CB, and the decoupling capacitor CD are packaged together.

Figure 13:
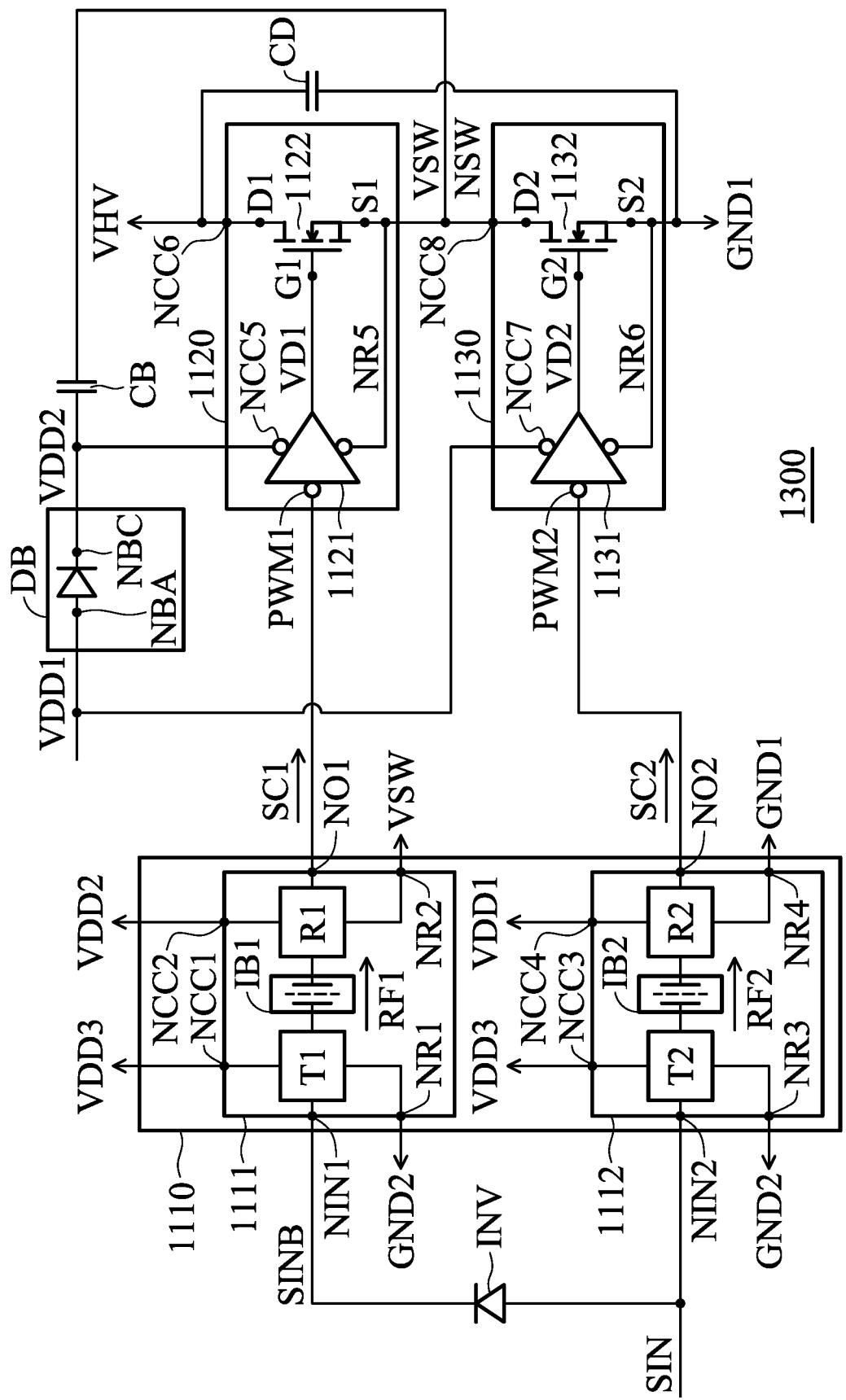
FIG. 13 is a block diagram of an integrated circuit in accordance with yet another embodiment of the invention.

FIG. 13 is a block diagram of an integrated circuit in accordance with another embodiment of the invention. As shown in FIG. 13, the integrated circuit 1300 includes a isolator 1110, a first power circuit 1120, a second power circuit 1130, a bootstrap diode DB, and a bootstrap capacitor CB, in which the isolator 1110 includes a first sub-isolator 1111 and a second sub-isolator 1112.

The first sub-isolator 1111 includes a first transmitter T1, a first receiver R1, and a first isolation barrier IB1. The first transmitter T1, which is supplied by a third supply voltage VDD3 and a second ground GND2, modulates the reverse input signal SINB to generate a first radio signal RF1 across the first isolation barrier D31. The first receiver R1, which is supplied by the second supply voltage VDD2 and the switch voltage VSW, demodulates the first radio signal RF1 to generate the first control signal SC1. The first isolation barrier IB1 is configured to electrically isolate the first transmitter T1 from the first receiver R1.

The second sub-isolator 1112 includes a second transmitter T2, a second receiver R2, and a second barrier IB2. The second transmitter T2, which is supplied by the third supply voltage VDD3 and a second ground GND2, modulates the input signal SIN to generate a second radio signal RF2 across the second isolation barrier IB2. The second receiver R2, which is supplied by the first supply voltage VDD1 and the first ground GND1, demodulates the second radio signal RF2 to generate the second control signal SC2. The second isolation barrier IB2 is configured to electrically isolate the second transmitter T2 from the second receiver R2.

According to an embodiment of the invention, the first ground GND1 may be identical to the second ground GND2. According to another embodiment of the invention, the first ground GND1 may not be identical to the second ground GND2. According to an embodiment of the invention, the high voltage VHV exceeds the first supply voltage VDD1, the second supply voltage VDD2, and the third supply voltage VDD3.

According to an embodiment of the invention, the first supply voltage VDD1 may be identical to the third supply voltage VDD3. According to another embodiment of the invention, the first supply voltage VDD1 may not be identical to the third supply voltage VDD3.

As shown in FIG. 13, the integrated circuit 1300 further includes a decoupling capacitor CD. The decoupling capacitor CD is coupled between the high voltage VHV and the first ground GND1. According to an embodiment of the invention, the first sub-isolator 1111, the second sub-isolator 1112, the first power circuit 1120, the second power circuit 1130, and the decoupling capacitor CD are packaged together. According to another embodiment of the invention, the first sub-isolator 1111, the second sub-isolator 1112, the first power circuit 1120, the second power circuit 1130, the bootstrap capacitor CB, and the decoupling capacitor CD are packaged together.

Figure 14:
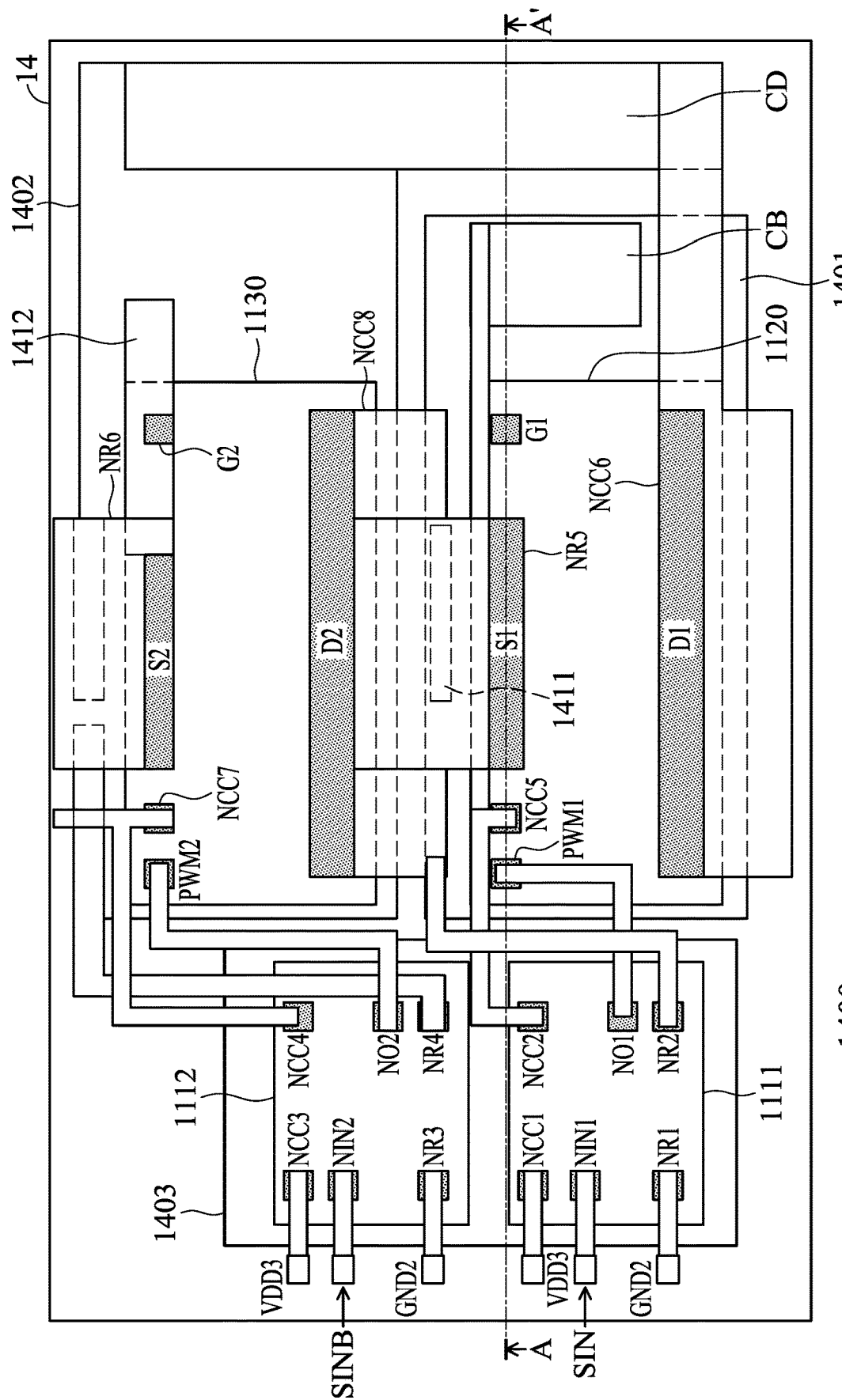
FIG. 14 shows a top view of a package structure in accordance with an embodiment of the invention.

FIG. 14 shows a top view of a package structure in accordance with an embodiment of the invention. As shown in FIG. 14, the package structure 1400 includes the decoupling capacitor CD, the bootstrap capacitor CB, the first sub-isolator 1111, the second sub-isolator 1112, the first power circuit 1120, and the second power circuit 1130, which are shown in FIG. 13. According to an embodiment of the invention, the package structure 1400 is deposited on a substrate 14.

As shown in FIG. 14, the package structure 1400 further includes a first conductive layer 1401, a second conductive layer 1402, and a third conductive layer 1403. The first conductive layer 1401, the second conductive layer 1402, and the third conductive layer 1403 are formed on the substrate 14.

As shown in FIG. 14, the first power circuit 1120 and the bootstrap capacitor CB are deposited on the first conductive layer 1401. The second power circuit 1130 and the decoupling capacitor CD are deposited on the second conductive layer 1402. The first sub-isolator 1111 and the second sub-isolator 1112 are deposited on the third conductive layer 1403.

According to an embodiment of the invention, the first conductive layer 1401, the second conductive layer 1402, and the third conductive layer 1403 are electrically isolated from one another. According to an embodiment of the invention, the first conductive layer 1401 is electrically coupled to the first ground GND1, and the second conductive layer 1402 is electrically coupled to the switch voltage VSW which is coupled to the fifth reference terminal NR5.

As shown in FIG. 14, the fifth reference terminal NR5, which is coupled to the source terminal S1 of the first power transistor 1122, is electrically coupled to the first conductive layer 1401 through a wiring layer and a first conductor 1411. According to an embodiment of the invention, the first conductor 1411 is configured to electrically couple the wiring layer to the first conductive layer 1401.

The sixth reference terminal NR6, which is coupled to the source terminal S2 of the second power transistor 1132, is electrically coupled to the second conductive layer 1402 through the wiring layer and a second conductor 1412. According to an embodiment of the invention, the second conductor 1412 is configured to electrically couple the wiring layer to the second conductive layer 1402.

According to an embodiment of the invention, the bootstrap diode DB shown in FIG. 13 is placed outside of the package structure 1400.

Figure 15:
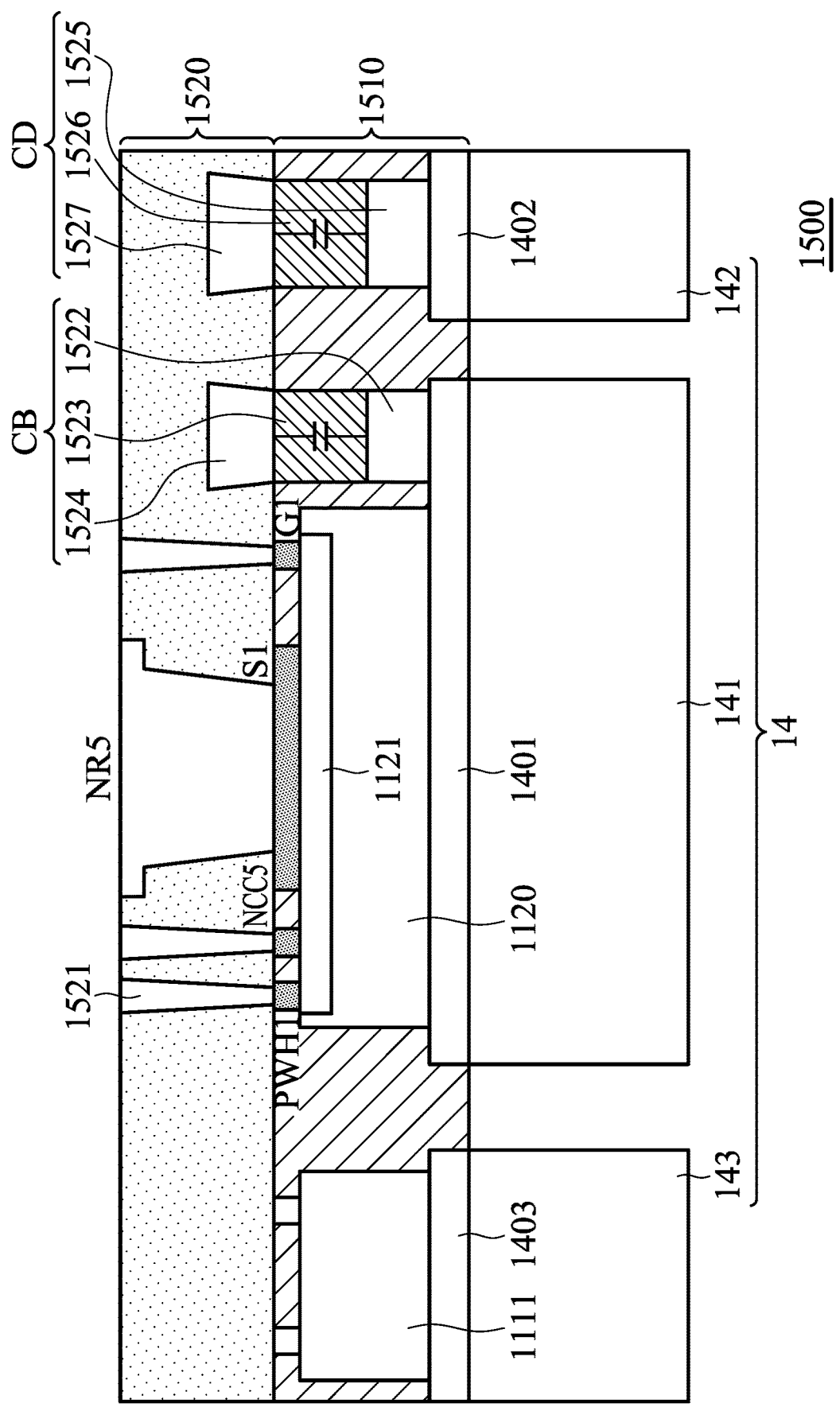
FIG. 15 shows a cross view of a package structure in accordance with an embodiment of the invention.

FIG. 15 shows a cross view of a package structure in accordance with an embodiment of the invention. As shown in FIG. 15, the package structure 1500 shows the cross-sectional view along the line from A to A' shown in FIG. 14.

The package structure 1500 includes the substrate 14, the first sub-isolator 1111, the first power circuit 1120, the bootstrap capacitor CB, the decoupling capacitor CD, and a wiring layer 1521. The substrate 14 includes a first carrier 141, a second carrier 142, and a third carrier 143, in which the first carrier 141, the second carrier 142, and the third carrier 143 are insulated from one another.

The first power circuit 1120 and the bootstrap capacitor CB are deposited on the first carrier 141. The decoupling capacitor CD and the second power circuit 1130 (not shown in FIG. 15) are deposited on the second carrier 142. The first sub-isolator 1111 and the second sub-isolator 1112 (not shown in FIG. 15) are deposited on the third carrier 143.

According to some embodiments of the invention, the first conductive element 1522 and the first power circuit 1120 are deposited on the first conductive layer 1401, which is deposited on the first carrier 141. The decoupling capacitor CD and the second power circuit 1130 (not shown in FIG. 15) are deposited on the second conductive layer 1402, which is deposited on the second carrier 142. The first sub-isolator 1111 and the second sub-isolator 1112 (not shown in FIG. 15) are deposited on the third conductive layer 1403, which is deposited on the third carrier 143.

The material of the first carrier 141, the second carrier 142, and the third carrier 143 may be or include stainless steel, copper (Cu), aluminum (Al), golden (Au), silver (Ag), tin (Sn), platinum (Pt), an alloy thereof, or the like. The first carrier 141 and the first conductive layer 1401 may be the same or different materials. Similarly, the second carrier 142 and the second conductive layer 1402 may be the same or different materials. The third carrier 143 and the third conductive layer 1403 may be the same or different materials.

The package structure 1500 further includes a first dielectric layer 1510 and a second dielectric layer 1520. The first sub-isolator 1111, the second sub-isolator 1112 (not shown in FIG. 15), the first power circuit 1120, the second power circuit 1130 (not shown in FIG. 15), the bootstrap capacitor CB, and the decoupling capacitor CF are bonded together in the first dielectric layer 1510.

The wiring layer 1521 is provided on the first dielectric layer 1510 through the second dielectric layer 1520. In some embodiments, the first dielectric layer 1510 is formed by a molding process through a first dielectric medium so as to bond the first sub-isolator 1111, the second sub-isolator 1112, the first power circuit 1120, and the second power circuit 1130.

The wiring layer 1521 is configured to electrically couple the first sub-isolator 1111, the second sub-isolator 1112, the first power circuit 1120, and the second power circuit 1130. In some embodiments, the material of the wiring layer 1521 is metal and is made by laser drill and metal plating process. The details of the production method will be detailed later.

As shown in FIG. 15, the bootstrap capacitor CB includes a first conductive element 1522, a first dielectric element 1523 and a second conductive element 1524. The first conductive element 1522 and the second conductive element 1524 can be a copper pillar. The first conductive element 1522 is provided in the first dielectric layer 1510. Similarly, the decoupling capacitor CD includes a third conductive element 1525, a second dielectric element 1526, and a fourth conductive element 1527. The third conductive element 1525 and the fourth conductive element 1527 can be a copper pillar. The third conductive element 1525 is provided in the first dielectric layer 1510.

As shown in FIG. 15, the first dielectric element 1523 and the second dielectric element 1526 are provided on the first conductive element 1522. The second conductive element 1524 and the fourth conductive element 1527 are provided on the first dielectric element 1523. The first conductive element 1522, the first dielectric element 1523 and the second conductive element 1524 form the bootstrap capacitor CB. The third conductive element 1525, the second dielectric element 1526, and the fourth conductive element 1527 form the decoupling capacitor CD.

In order to adjust the capacitance value of the bootstrap capacitor CB, the material of the first dielectric element 1523 may be different from the material of the first dielectric layer 1510 and the material of the second dielectric layer 1520. For example, the material of the first dielectric element 1523 can be ceramic or mica, which is different from the material of the first dielectric medium. In some other embodiments, the bootstrap capacitor CB does not include the first dielectric element 1523. The first conductive element 1522 is spaced apart from the second conductive element 1524 by a first distance. The first dielectric medium of the first dielectric layer 1510 can fill the space between the first conductive element 1522 and the second conductive element 1524. In other words, the material of the first dielectric element 1523 may be the same as the material of the first dielectric layer 1510.

In order to adjust the capacitance value of the decoupling capacitor CD, the material of the second dielectric element 1526 may be different from the material of the first dielectric layer 1510 and the material of the second dielectric layer 1520. For example, the material of the second dielectric element 1526 can be ceramic or mica, which is different from the material of the first dielectric medium. In some other embodiments, the decoupling capacitor CD does not include the second dielectric element 1526. The third conductive element 1525 is spaced apart from the fourth conductive element 1527 by a second distance. The first dielectric medium of the first dielectric layer 1510 can fill the space between the third conductive element 1525 and the fourth conductive element 1527. In other words, the material of the second dielectric element 1526 may be the same as the material of the first dielectric layer 1510.

According to some embodiments of the invention, the first distance of the bootstrap capacitor CB may or may not be equal to the second distance of the decoupling capacitor CD.

As shown in FIG. 15, in some embodiments, the first conductive element 1522 and the first dielectric element 1523 are deposited in the first dielectric layer 1510. The second conductive element 1524 is deposited in the second dielectric layer 1520. The second conductive element 1524 and the wiring layer 1521 are bonded through the second dielectric layer 1520, and the second conductive element 1524 is electrically coupled to the first power circuit 1120 through the wiring layer 1521. However, in other embodiments, according to different production methods, the first conductive element 1522, the first dielectric element 1523 and the second conductive element 1524 may be all deposited in the first dielectric layer 1510 and bonded through the first dielectric medium of the first dielectric layer 1510. The second conductive element 1524 is still electrically coupled to the first power circuit 1120 through the wiring layer 1521. The details of the production method will be detailed later.

As shown in FIG. 15, in some embodiments, the third conductive element 1525 and the second dielectric element 1526 are deposited in the first dielectric layer 1510. The fourth conductive element 1527 is deposited in the second dielectric layer 1520. The fourth conductive element 1527 and the wiring layer 1521 are bonded through the second dielectric layer 1520, and the fourth conductive element 1527 is electrically coupled to the first power circuit 1120 through the wiring layer 1521. However, in other embodiments, according to different production methods, the third conductive element 1525, the second dielectric element 1526 and the fourth conductive element 1527 may be all deposited in the first dielectric layer 1510 and bonded through the first dielectric medium of the first dielectric layer 1510. The fourth conductive element 1527 is still electrically coupled to the first power circuit 1120 through the wiring layer 1521. The details of the production method will be detailed later.

Figure 16B:
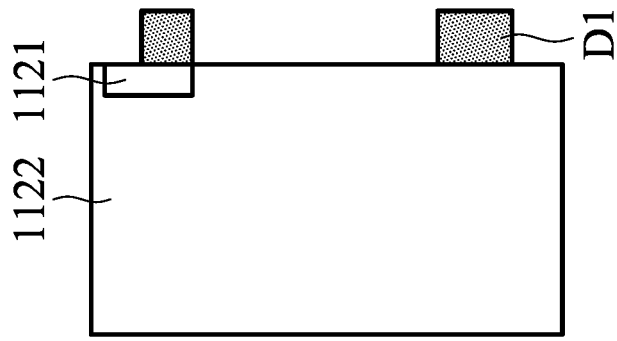
FIGS. 16A-16B show a top view and a cross-sectional view of the first power circuit in accordance with an embodiment of the invention.
Figure 16A:
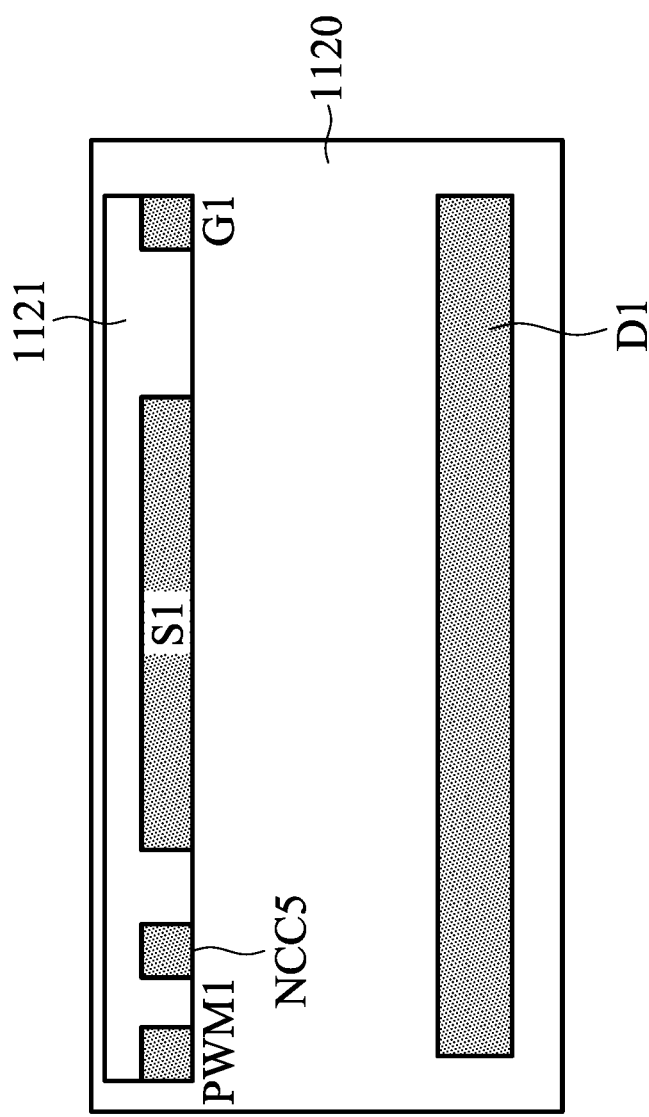

FIGS. 16A-16B show a top view and a cross-sectional view of the first power circuit in accordance with an embodiment of the invention. FIG. 16A shows the top view of the first power circuit 1120. As shown in FIG. 16A, the source terminal S1, the gate terminal G1 and the drain terminal D1 of the first power transistor 1122 are illustrated respectively. The first driving circuit 1121 is deposited below the source terminal S1 and the gate terminal G1 of the first power transistor 1122.

FIG. 16B shows a cross-sectional view of the first power circuit 1120. As shown in FIG. 16B, the first power transistor 1122 is deposited below the first driving circuit 1121 and the drain terminal D1 of the first power transistor 1122.

Referring to FIG. 14 and FIG. 15, the first conductor 1411 in FIG. 14 may be a Cu pillar. The first conductor 1411 is disposed on the first carrier 141 through the first conductive layer 1401 so as to electrically couple to a first side (e.g., bottom surface) of the bootstrap capacitor CB. The wiring layer 1521 in FIG. 15 is electrically coupled to a second side (e.g., top surface) of the bootstrap capacitor CB. In other words, the source terminal S1 of the first power transistor 1122 (i.e., the fifth reference terminal NR5) is electrically coupled to the first conductive layer 1401 through the wiring layer 1521 and the first conductor 1411.

The second conductor 1412 in FIG. 14 may be a Cu pillar. The second conductor 1412 is disposed on the second carrier 142 through the second conductive layer 1402 so as to electrically couple to a first side (e.g., bottom surface) of the decoupling capacitor CD. The wiring layer 1521 in FIG. 15 is electrically coupled to a second side (e.g., top surface) of the decoupling capacitor CD. In other words, the source terminal S2 of the second power transistor 1132 (i.e., the sixth reference terminal NR6) is electrically coupled to the second conductive layer 1402 through the wiring layer 1521 and the second conductor 1412.

Figure 17A:
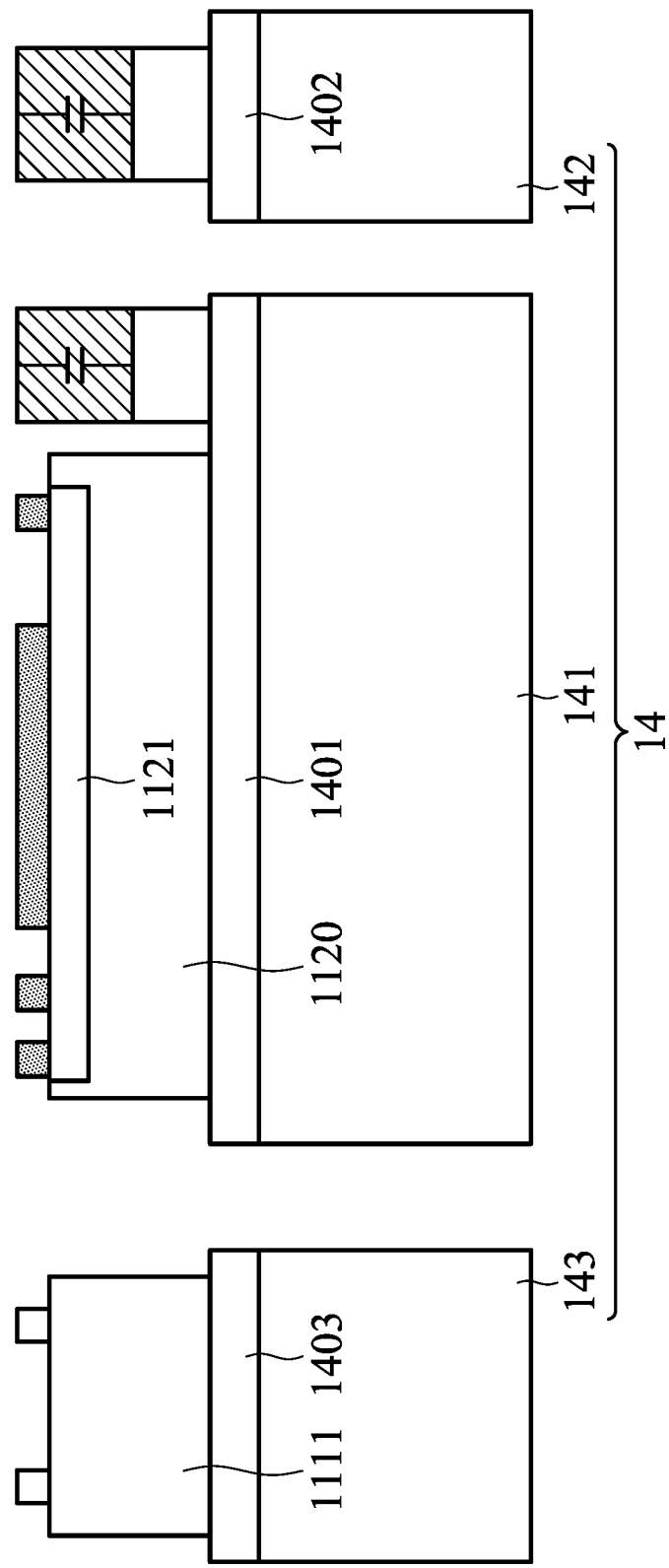
FIGS. 17A-17F illustrate processes for fabricating the package structure 1400 of FIG. 14 and the package structure 1500 of FIG. 15 in accordance with an embodiment of the invention.

FIGS. 17A-17F illustrate a method for fabricating the package structure 1400 of FIG. 14 and the package structure 1500 of FIG. 15 in accordance with an embodiment of the invention. As shown in FIG. 17A, the first conductive element 1522, the third conductive element 1525, the first sub-isolator 1111, the second sub-isolator 1112, the first power circuit 1120, the second power circuit 1130, the first conductor 1411, and the second conductor 1412 are deposited on the substrate 14.

In some embodiments, the first conductive element 1522 of the bootstrap capacitor CB is formed on the first carrier 141 with the first conductive layer 1401 therebetween. The first power circuit 1120 and the second power circuit 1130 are disposed on the first carrier 141. The decoupling capacitor CD is formed on the second carrier 142 with the second conductive layer 1402 therebetween. The first sub-isolator 1111 and the second sub-isolator 1112 are deposited on the third carrier 143 with the third conductive layer 1403 therebetween.

As shown in FIG. 17A, the first dielectric element 1523 and the second dielectric element 1526 are then formed on the first conductive element 1522 and the third conductive element 1525 respectively.

Figure 17B:
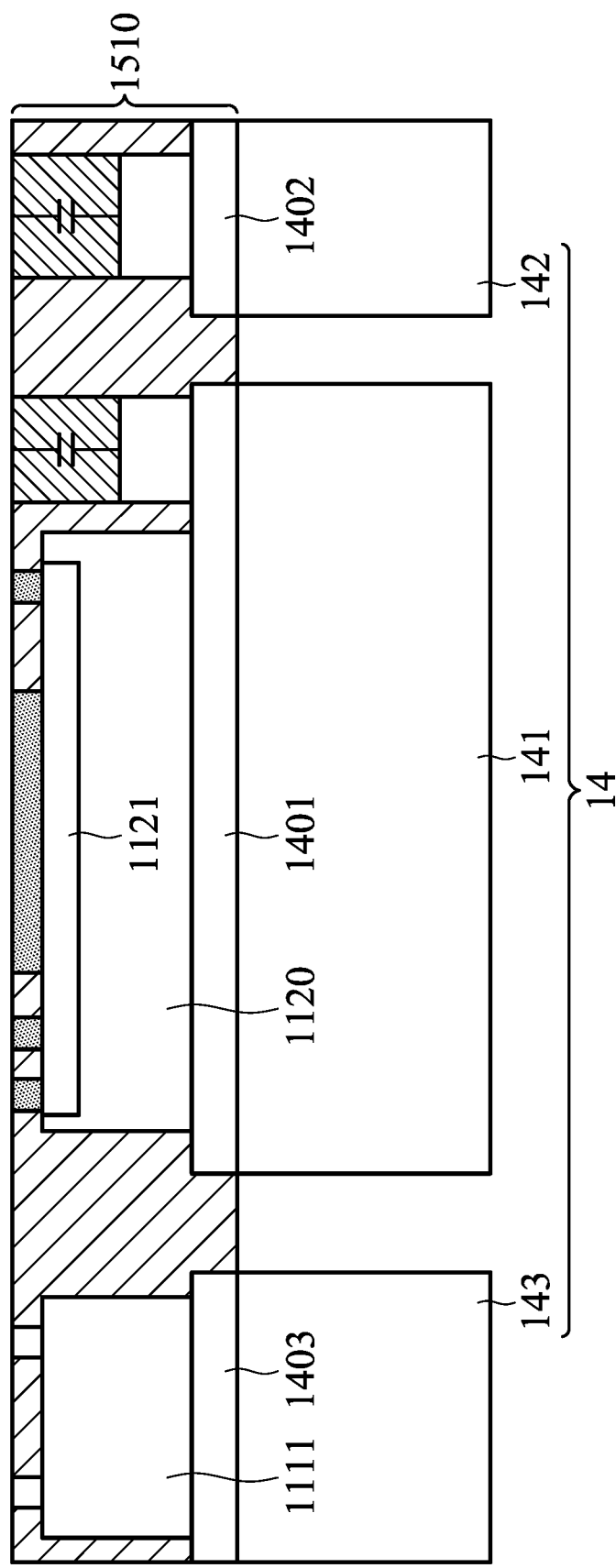

As shown in FIG. 17B, the first conductive element 1522, the first dielectric element 1523, the third conductive element 1525, the second dielectric element 1526, the first sub-isolator 1111, the second sub-isolator 1112, the first power circuit 1120, and the second power circuit 1130 are bonded together through the first dielectric medium to form the first dielectric layer 1510. In some embodiments, the material of the first dielectric medium may be Epoxy or Bismaleimide Triazine Resin.

Figure 17C:
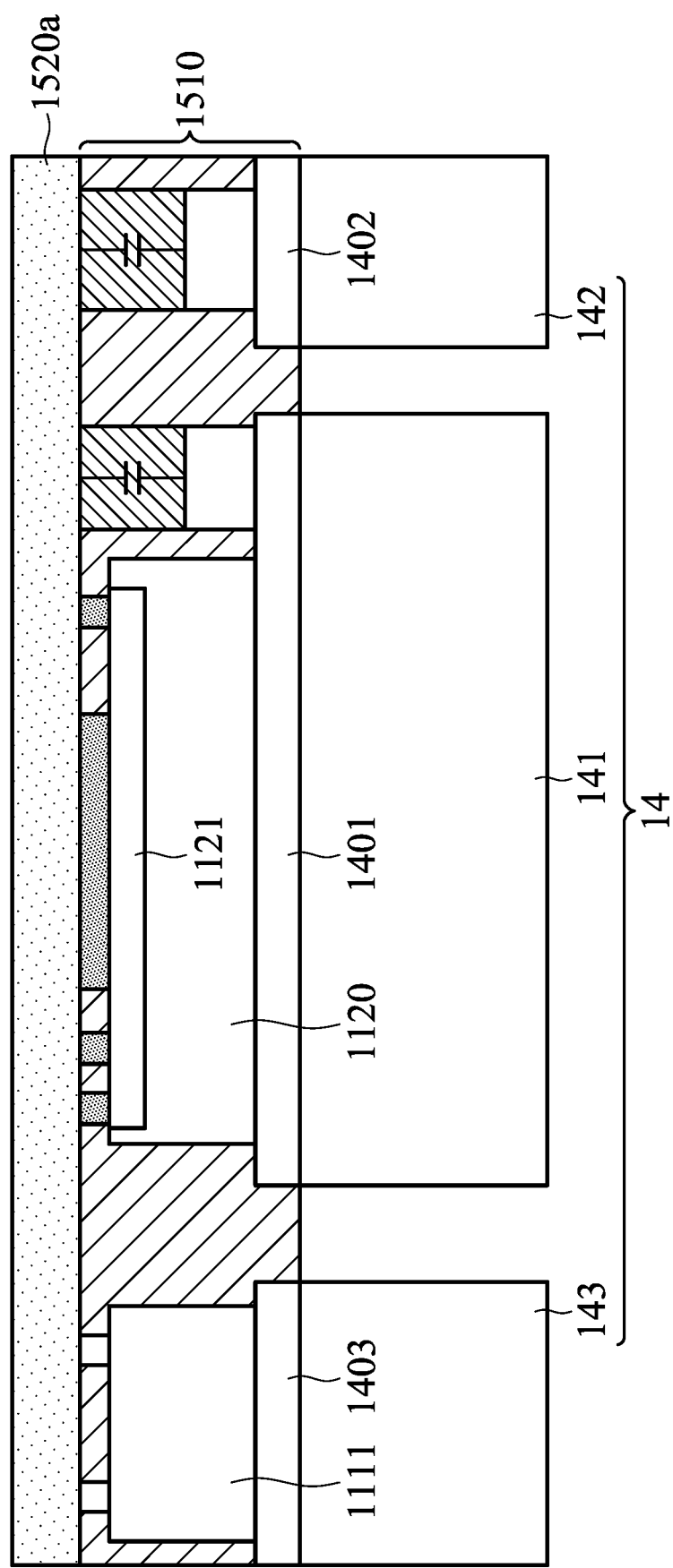
Figure 17D:
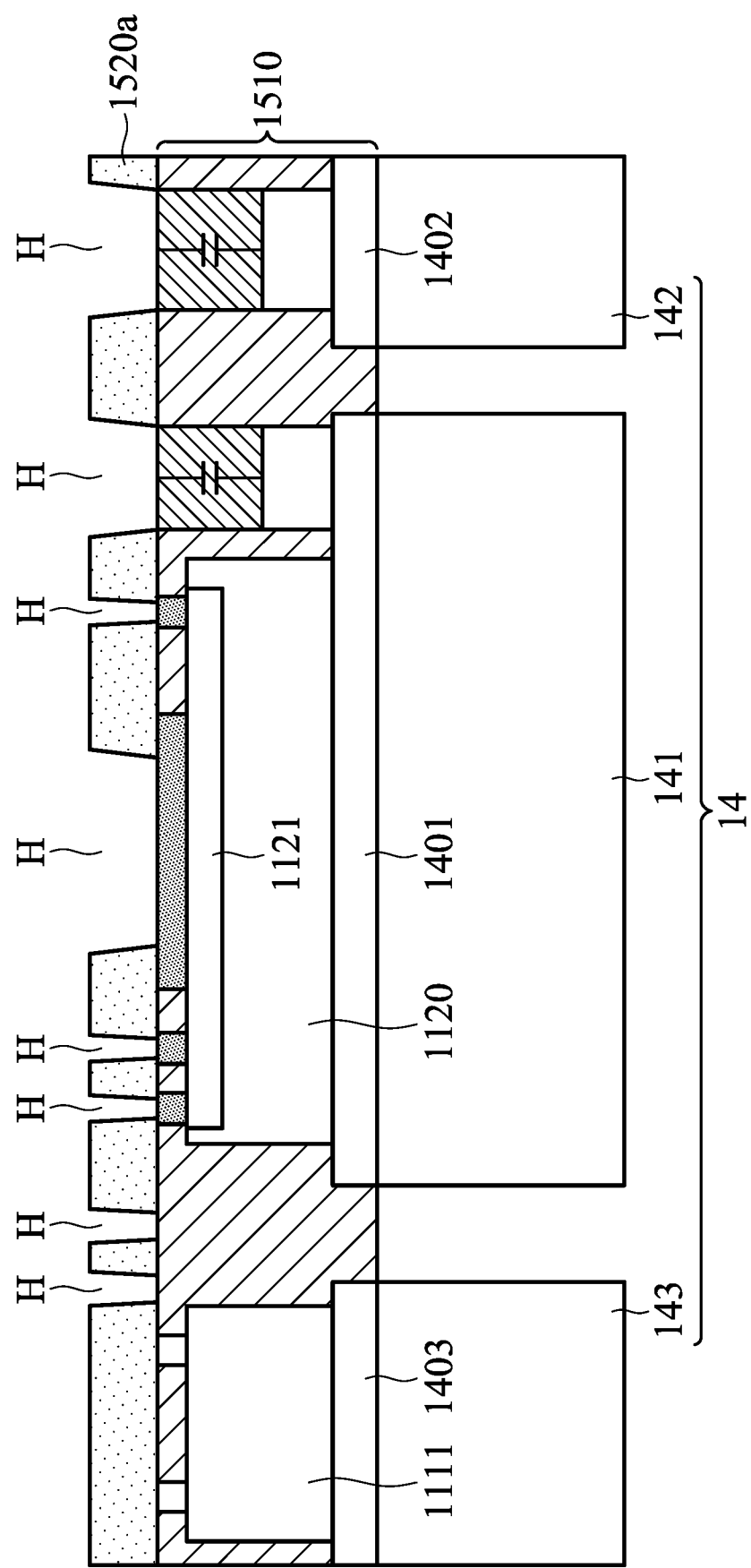
Figure 17E:
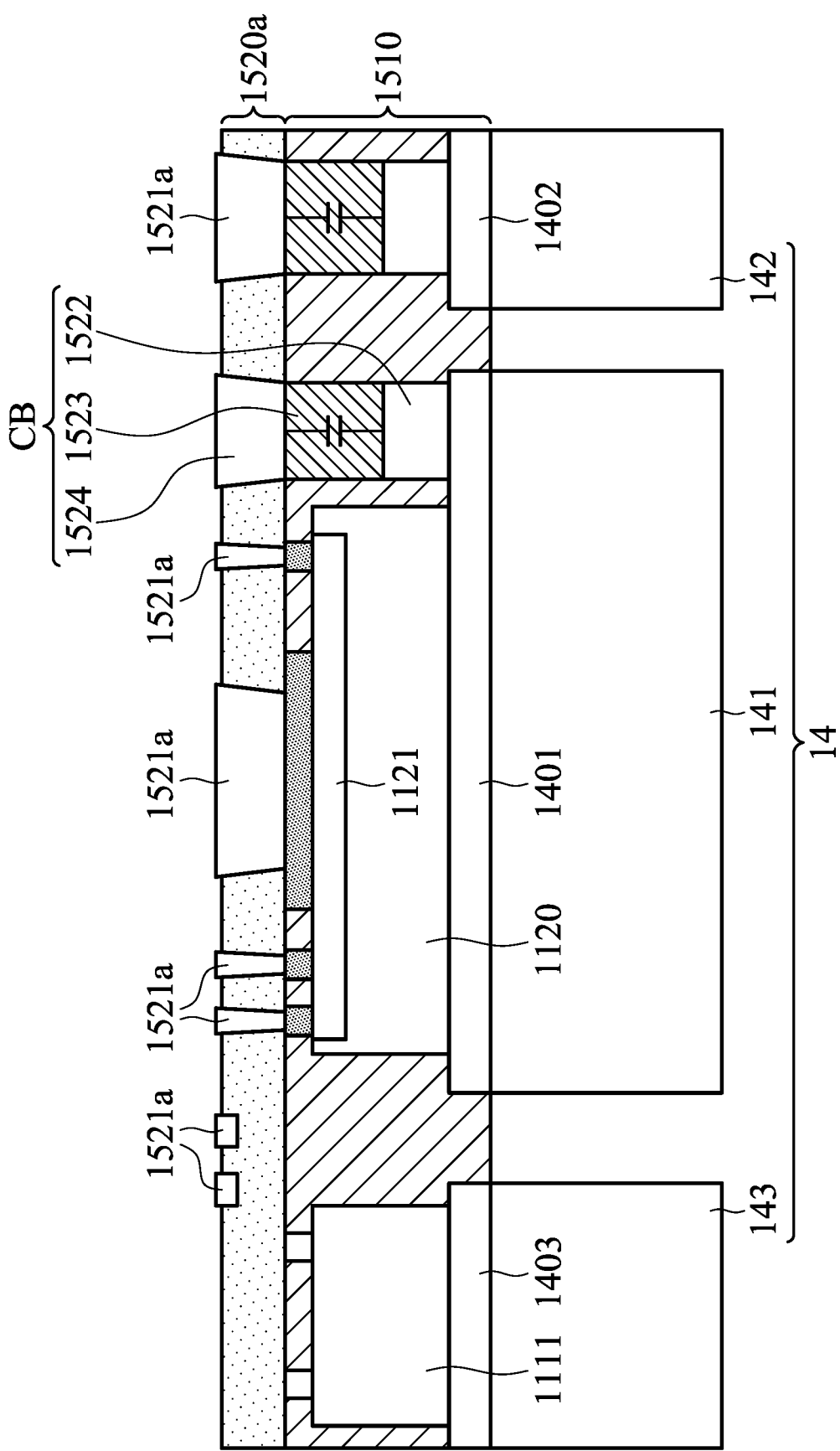

As shown in FIGS. 17C-17E, the first molding layer 1520a on the first dielectric layer 1510 is formed by a molding process. Then, multiple first metal units 1521a are formed by the laser drill and metal plating process. In some embodiments, as shown in FIG. 17C and FIG. 17D, after forming the first molding layer 1520a by the molding process, etching the first molding layer 1520a to form multiple holes H corresponding to the first conductive element 1522, first conductor 1411, the second conductor 1412, and all the terminals of the first sub-isolator 1111, the second sub-isolator 1112, the first power circuit 1120, and the second power circuit 1130. Then, as shown in FIG. 17E, through the laser drill and metal plating process to the first molding layer 1520a, forming multiple first metal units 1521a on the first dielectric layer 1510. In some embodiments, one of the first metal units 1521a becomes the second conductive element 1524, and one of the first metal units 1521a becomes the fourth conductive element 1527. The first molding layer 1520a on the first dielectric layer 1510 is configured to fix the second conductive element 1524, the fourth conductive element 1527 and the first metal units 1521a.

Figure 17F:
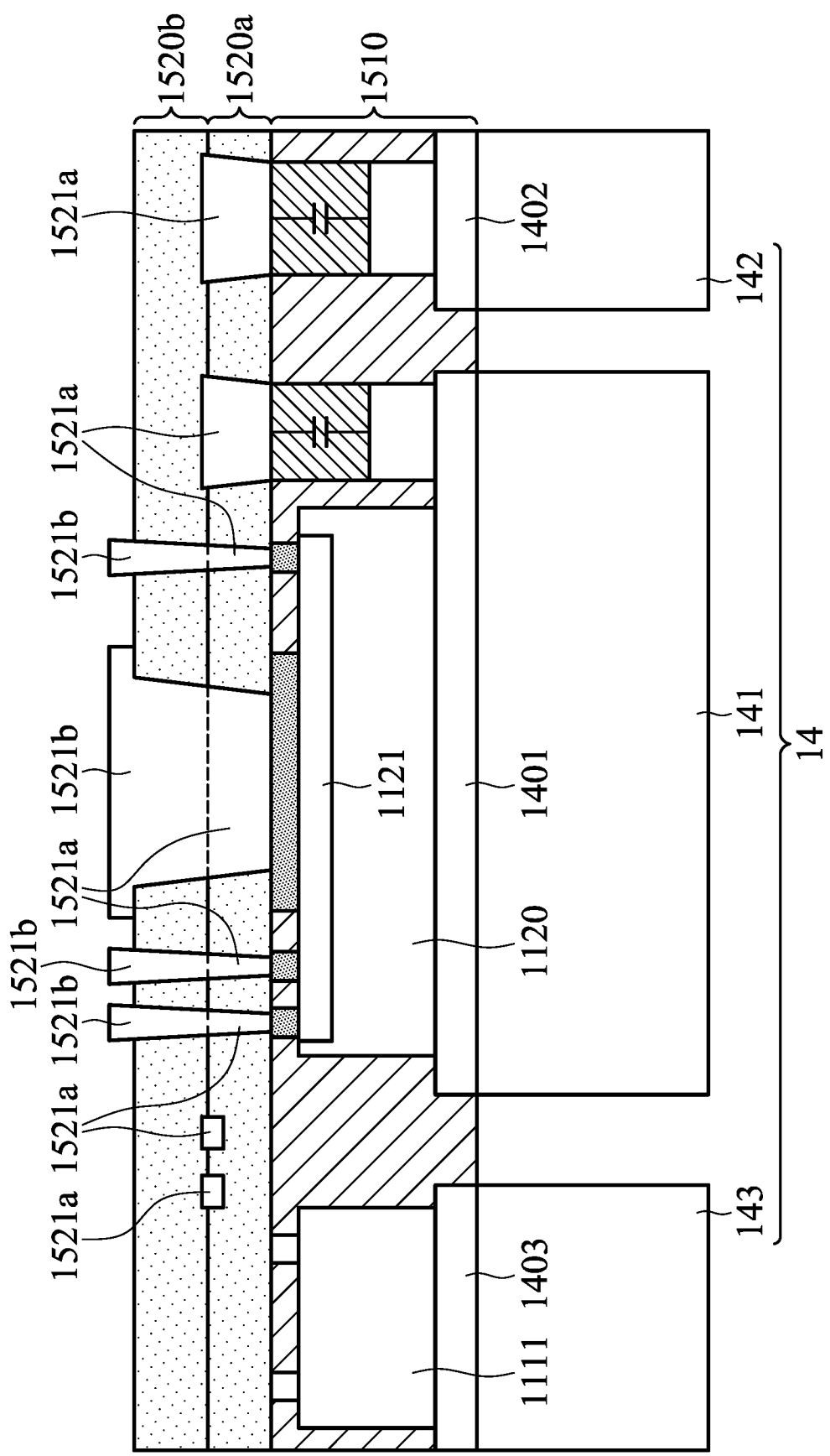

Referring to the FIG. 17F, a second molding layer 1520b and multiple second metal units 1521b are formed and disposed on the first molding layer 1520a after the first molding layer 1520a is formed. The first metal units 1521a and the second metal units 1521b form the wiring layer 1521, so that the first sub-isolator 1111, the second sub-isolator 1112, the first power circuit 1120, the second power circuit 1130, the bootstrap capacitor CB, and the decoupling capacitor CD are electrically coupled as illustrated in FIG. 13.

In the method provided herein, it can directly dispose the bootstrap capacitor CB and/or the decoupling capacitor CD, which is already packaged as a package structure, on the substrate 14. That is, the first conductive element 1522, the first dielectric element 1523 and the second conductive element 1524 are first packaged into the bootstrap capacitor CB, and the third conductive element 1525, the second dielectric element 1526, and the fourth conductive element 1527 are first packaged into the decoupling capacitor CD. Then, the bootstrap capacitor CB and the decoupling capacitor CD are placed on the substrate 14.

According to other embodiments of the invention, the first conductive element 1522, the first dielectric element 1523, the third conductive element 1525 and the second dielectric element 1526 are first packaged together and be disposed on the substrate 14. Then, after forming the first dielectric layer 1510 and depositing the first conductive element 1522, the first dielectric element 1523, the third conductive element 1525 and the second dielectric element 1526, the second conductive 1224 and the fourth conductive element 1527 are formed on the first dielectric layer 1510.

In the embodiment shown in FIGS. 17A-17F, the second conductive element 1524 is formed on the first dielectric element 1523 and disposed in the second dielectric layer 1520, and the fourth conductive element 1527 is formed on the second dielectric element 1526 and disposed on the second dielectric layer 1520. In some embodiments of other method, after forming the first dielectric element 1523 and the second dielectric element 1526 on the first conductive element 1522 and the third conductive element 1525 respectively, the method is disposing the second conductive element 1524 on the first dielectric element 1523 and the fourth conductive element 1527 on the second dielectric element 1526.

Then, bonding the first conductive element 1522, the first dielectric element 1523, the second conductive element 1524, the third conductive element 1525, the second dielectric element 1526, and the fourth conductive element 1527 through the first dielectric medium. That is, the first conductive element 1522, the first dielectric element 1523, the second conductive element 1524, the third conductive element 1525, the second dielectric element 1526, and the fourth conductive element 1527 are all deposed in the first dielectric layer 1510.

In some embodiments, after the first conductive element 1522 and the third conductive element 1525 disposed on the substrate 14, the first dielectric medium fixes the first conductive element 1522, the third conductive element 1525, the first sub-isolator 1111, the second sub-isolator 1112, the first power circuit 1120, and the second power circuit 1130. In this embodiment, the first dielectric medium is used for the first dielectric element 1523 and/or the second dielectric element 1526.

After forming the first dielectric layer 1510, the second conductive element 1524 is deposited on the first dielectric layer 1510, and the fourth conductive element 1527 is deposited on the first dielectric layer 1510. The first conductive element 1522 is spaced apart from the second conductive element 1524 by a first distance, and the third conductive element 1525 is spaced apart from the fourth conductive element 1527 with a second distance, in which the first distance may or may not be equal to the second distance.

Accordingly, the first conductive element 1522, the second conductive element 1524 and the first dielectric medium between the first conductive element 1522 and the second conductive element 1524 form the bootstrap capacitor CB, and the third conductive element 1525, the fourth conductive element 1527 and the first dielectric medium between the third conductive element 1525 and the fourth conductive element 1527 form the decoupling capacitor CD.

According to some embodiments of the invention, after the first metal units 1521*a* are formed by the laser drill and metal plating process, the second dielectric layer 1520*b* is formed once and multiple holes are also formed again. Then, the second metal units 1522*b* are formed by the laser drill and metal plating process. Therefore, the first sub-isolator 1111, the second sub-isolator 1112, the first power circuit 1120, the second power circuit 1130, the bootstrap capacitor CB, and the decoupling capacitor CD are electrically coupled accordingly.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An integrated circuit, comprising:
   a first power transistor, integrated with a first driving circuit;
   a second power transistor, integrated with a second driving circuit;
   a decoupling capacitor, coupled between a high voltage and a first ground; and
   an isolator, providing a first control signal and a second control signal to the first power transistor and the second power transistor respectively, according to an input signal.

2. The integrated circuit of claim 1, further comprising a first power circuit and a second power circuit,
   wherein the first power circuit comprises the first driving circuit and the first power transistor, and
   wherein the second power circuit comprises the second driving circuit and the second power transistor.

3. The integrated circuit of claim 2, further comprising:
   a bootstrap diode, comprising a bootstrap anode and a bootstrap cathode, wherein the bootstrap anode is coupled to a first supply voltage and the bootstrap cathode is coupled to a second supply voltage; and
   a bootstrap capacitor, coupled between the second supply voltage and a switch voltage of a switch node.

4. The integrated circuit of claim 3, wherein the first driving circuit is supplied by the second supply voltage and the switch voltage and generates a first driving voltage at a first driving node according to the first control signal, and
   wherein the first power transistor supplies the high voltage to the switch node according to the first driving voltage.

5. The integrated circuit of claim 4, wherein the second driving circuit is supplied by the first supply voltage and the first ground and generates a second driving voltage at a second driving node according to the second control signal, and
   wherein the second power transistor pulls the switch voltage down to the first ground according to the second driving voltage.

6. The integrated circuit of claim 5, wherein each of the first power transistor and the second power transistor is a GaN transistor.

7. The integrated circuit of claim 5, wherein the high voltage exceeds the first supply voltage and the second supply voltage.

8. The integrated circuit of claim 5, wherein the isolator comprises:
a first sub-isolator, comprising:
a first transmitter, supplied with a third supply voltage and a second ground and transmitting a first radio signal according to the input signal;
a first receiver, supplied with the second supply voltage and the switch voltage and generating the first control signal according to the first radio signal; and
a first isolation barrier, configured to electrically isolate the first transmitter from the first receiver; and
a second sub-isolator, comprising:
a second transmitter, supplied with a third supply voltage and a second ground and transmitting a second radio signal according to the input signal;
a second receiver, supplied with the first supply voltage and the first ground and generating the first control signal according to the first radio signal; and
a second isolation barrier, configured to electrically isolate the second transmitter from the second receiver.

9. The integrated circuit of claim 8, wherein the first sub-isolator, the second sub-isolator, the first power circuit, a second power circuit, and the decoupling capacitor are packaged together.

10. The integrated circuit of claim 5, wherein the isolator comprises:
a transmitter, supplied with a third supply voltage and a second ground and transmitting a first radio signal and a second radio signal according to the input signal;
a first receiver, supplied with the second supply voltage and the switch voltage and generating the first control signal according to the first radio signal;
a first isolation barrier, configured to electrically isolate the transmitter from the first receiver;
a second receiver, supplied with the first supply voltage and the first ground and generating the first control signal according to the first radio signal; and
a second isolation barrier, configured to electrically isolate the transmitter from the second receiver.

11. The integrated circuit of claim 5, wherein each of the first power circuit and the second power circuit comprises:
a pre-driver, generating a first internal signal according to a control signal, wherein the pre-driver is configured to improve driving capability of the control signal, wherein a driving circuit generates a driving voltage according to the first internal signal.

12. The integrated circuit of claim 11, wherein each of the first driving circuit and the second driving circuit comprises:
a high-side transistor, providing a supply voltage to a driving node according to a high-side voltage of a high-side node;
a low-side transistor, coupling the driving node to a ground according to a first internal signal; and
a charge pump, coupled to the high-side node and the driving node, wherein the charge pump is configured to generate a high-side voltage that exceeds the supply voltage according to the first internal signal.

13. The integrated circuit of claim 12, wherein each of the first power circuit and the second power circuit comprises:
a hysteresis circuit, coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.

14. The integrated circuit of claim 12, wherein each of the first driving circuit and the second driving circuit further comprises:
a high-side normally-on transistor, comprising a source terminal coupled to the driving node, a gate terminal coupled to the driving node, and a drain terminal supplied with the supply voltage, wherein the high-side normally-on transistor is configured to improve driving capability of the high-side transistor.

15. A package structure, comprising:
a substrate having at least two carriers insulated from each other;
a decoupling capacitor provided on one of the at least two carriers;
a circuit, bonded to the decoupling capacitor in a first dielectric layer; and
a wiring layer, configured to electrically couple the decoupling capacitor to the circuit,
wherein the wiring layer is provided on the first dielectric layer through a second dielectric layer.

16. The package structure of claim 15, wherein the decoupling capacitor comprises:
a first conductive element, formed in the first dielectric layer;
a first dielectric element, formed on the first conductive element; and
a second conductive element, formed on the first dielectric element.

17. The package structure of claim 16 further comprising:
a bootstrap capacitor, provided on the substrate, wherein the integrated circuit is bonded to the bootstrap capacitor in the first dielectric layer or the second dielectric layer.

18. The package structure of claim 17, wherein the bootstrap capacitor comprises:
a third conductive element, formed in the first dielectric layer;
a second dielectric element, formed on the first conductive element; and
a fourth conductive element, formed on the second dielectric element.

19. The package structure of claim 18, wherein a material of the first dielectric element and the second dielectric element is different than a material of the first dielectric layer and a material of the second dielectric layer.

20. The package structure of claim 17, wherein the circuit comprises:
an isolator, providing a first control signal and a second control signal according to an input signal;
a first power circuit, comprising:
a first driving circuit, supplied by a second supply voltage and a switch voltage and generating a first driving voltage at a first driving node according to the first control signal, wherein a bootstrap diode and the bootstrap capacitor are configured to boost a first supply voltage to the second supply voltage, wherein the bootstrap diode comprises a bootstrap anode coupled to the first supply voltage and a bootstrap cathode coupled to the second supply voltage, wherein the bootstrap capacitor is coupled between the second supply voltage and the switch voltage of a switch node; and a first power transistor, supplying a high voltage to the switch node according to the first driving voltage; and a second power circuit, comprising:

a second driving circuit, supplied by the first supply voltage and a first ground and generating a second driving voltage at a second driving node according to the second control signal; and a second power transistor, pulling the switch voltage down to the first ground according to the second driving voltage.

21. The package structure of claim 20, wherein each of the first power transistor and the second power transistor is a GaN transistor.

22. The package structure of claim 20, wherein the isolator comprises:

a first sub-isolator, comprising:

a first transmitter, supplied with a third supply voltage and a second ground and transmitting a first radio signal according to the input signal;

a first receiver, supplied with the second supply voltage and the switch voltage and generating the first control signal according to the first radio signal; and a first isolation barrier, configured to electrically isolate the first transmitter from the first receiver; and a second sub-isolator, comprising:

a second transmitter, supplied with a third supply voltage and a second ground and transmitting a second radio signal according to the input signal;

a second receiver, supplied with the first supply voltage and the first ground and generating the first control signal according to the first radio signal; and a second isolation barrier, configured to electrically isolate the second transmitter from the second receiver.

23. The package structure of claim 20, wherein the isolator comprises:

a transmitter, supplied with a third supply voltage and a second ground and transmitting a first radio signal and a second radio signal according to the input signal;

a first receiver, supplied with the second supply voltage and the switch voltage and generating the first control signal according to the first radio signal;

a first isolation barrier, configured to electrically isolate the transmitter from the first receiver;

a second receiver, supplied with the first supply voltage and the first ground and generating the first control signal according to the first radio signal; and a second isolation barrier, configured to electrically isolate the transmitter from the second receiver.

24. The package structure of claim 20, wherein the decoupling capacitor is coupled between the high voltage and the first ground.

25. The package structure of claim 20, wherein each of the first power circuit and the second power circuit comprises:

a pre-driver, generating a first internal signal according to a control signal, wherein the pre-driver is configured to improve driving capability of the control signal, wherein the driving circuit generates a driving voltage according to the first internal signal.

26. The package structure of claim 25, wherein each of the first driving circuit and the second driving circuit comprises:

a high-side transistor, providing a supply voltage to a driving node according to a high-side voltage of a high-side node;

a low-side transistor, coupling the driving node to a ground according to a first internal signal; and a charge pump, coupled to the high-side node and the driving node, wherein the charge pump is configured to generate a high-side voltage that exceeds the supply voltage according to the first internal signal.

27. The package structure of claim 26, wherein the high-side transistor and the low-side transistor are normally-off transistors.

28. A method of fabricating a package structure, comprising:

providing a substrate having at least two carriers insulated from each other;

providing a decoupling capacitor on one of the at least two carriers;

providing a circuit on the substrate;

bonding the decoupling capacitor and the circuit through a first dielectric medium to form a first dielectric layer;

forming a wiring layer on the first dielectric layer, so that the decoupling capacitor is electrically coupled to the circuit through the wiring layer; and bonding the wiring layer to the first dielectric layer through a second dielectric medium to form a second dielectric layer on the first dielectric layer.

29. The method of claim 28, wherein said providing the decoupling capacitor on the one of the at least two carriers further comprises:

forming a first conductive element in the first dielectric layer;

forming a first dielectric element on the first conductive element; and forming a second conductive element on the first dielectric element.

30. The method of claim 28, further comprising:

providing a bootstrap capacitor on the substrate; and bonding the bootstrap capacitor, the decoupling capacitor, and the integrated circuit through the first dielectric medium to form the first dielectric layer.

31. The method of claim 30, wherein said providing the bootstrap capacitor on the substrate further comprises:

forming a third conductive element in the first dielectric layer;

forming a second dielectric element on the third conductive element; and forming a fourth conductive element on the second dielectric element.

32. The method of claim 30, wherein the circuit comprises:

an isolator, comprising a first supply terminal, a second supply terminal, a third supply terminal, a fourth supply terminal, a first reference terminal, a second reference terminal, a third reference terminal, a fourth reference terminal, a first input terminal, a second input terminal, a first output terminal, and a second output terminal;

a first power circuit, comprising a fifth supply terminal coupled to the second supply terminal, a sixth supply terminal, a fifth reference terminal coupled to the second reference terminal, and a first PWM terminal coupled to the first output terminal; and a second power circuit, comprising a seventh supply terminal coupled to the fourth supply terminal, an eighth supply terminal coupled to the fifth reference terminal, a sixth reference terminal, and a second PWM terminal coupled to the second output terminal.

33. The method of claim 32, further comprising:
forming a first conductive layer on the substrate, wherein the first power circuit and the bootstrap capacitor are deposited on the first conductive layer, wherein the first conductive layer is coupled to a first side of the bootstrap capacitor and the fifth reference terminal, and a second side of the bootstrap capacitor is coupled to the fifth supply terminal through the wiring layer, wherein the sixth supply terminal is coupled to a third side of the decoupling capacitor through the wiring layer.

34. The method of claim 33, further comprising:
forming a second conductive layer on the substrate, wherein the second power circuit and the decoupling capacitor are deposited on the second conductive layer, wherein the second conductive layer is coupled to a fourth side of the decoupling capacitor and a sixth reference terminal.

35. The method of claim 34, further comprising:
forming a third conductive layer on the substrate, wherein the isolator is deposited on the third conductive layer.

36. The method of claim 35, wherein the first supply terminal and the third supply terminal are supplied with a third supply voltage, the second supply terminal and the fifth supply terminal are supplied with a second supply voltage, the first input terminal receives an input signal, the second input terminal receives a reverse input signal, the first output terminal generates a first control signal, the second output terminal generates a second control signal, the fourth supply terminal and the seventh supply terminal are supplied with a first supply voltage, the sixth supply terminal is supplied with a high voltage, the eighth supply terminal is coupled to the second reference terminal and the fifth reference terminal, the first reference terminal and the third reference terminal are coupled to a second ground, and the fourth reference terminal and the sixth reference terminal are coupled to a first ground, wherein the input signal and the reverse input signal are out-of-phase.

37. The method of claim 36, wherein the first power circuit comprises:
a first driving circuit, supplied by the second supply voltage and a switch voltage and generating a first driving voltage at a first driving node according to the first control signal; and
a first power transistor, coupling the sixth supply terminal to the fifth reference terminal according to the first driving voltage.

38. The method of claim 37, wherein the second power circuit comprises:
a second driving circuit, supplied by the first supply voltage and a first ground and generating a second driving voltage at a second driving node according to the second control signal; and
a second power transistor, coupling the eighth supply terminal to the first ground according to the second driving voltage.

39. The method of claim 38, wherein each of the first power transistor and the second power transistor is a GaN transistor.

40. The method of claim 38, wherein the integrated circuit further comprises:
a bootstrap diode, comprising a bootstrap anode and a bootstrap cathode, wherein the bootstrap anode is coupled to a first supply voltage and the bootstrap cathode is coupled to a second supply voltage.

41. The method of claim 38, wherein the high voltage exceeds the first supply voltage and the second supply voltage.

42. The method of claim 38, wherein the isolator comprises:
a first sub-isolator, comprising:
a first transmitter, supplied with a third supply voltage and a second ground and transmitting a first radio signal according to the input signal;
a first receiver, supplied with the second supply voltage and the switch voltage and generating the first control signal according to the first radio signal; and
a first isolation barrier, configured to electrically isolate the first transmitter from the first receiver; and
a second sub-isolator, comprising:
a second transmitter, supplied with a third supply voltage and a second ground and transmitting a second radio signal according to the reverse input signal;
a second receiver, supplied with the first supply voltage and the first ground and generating the first control signal according to the first radio signal; and
a second isolation barrier, configured to electrically isolate the second transmitter from the second receiver.

43. The method of claim 38, wherein each of the first power circuit and the second power circuit comprises:
a pre-driver, generating a first internal signal according to a control signal, wherein the pre-driver is configured to improve driving capability of the control signal, wherein a driving circuit generates a driving voltage according to the first internal signal.

44. The method of claim 43, wherein each of the first driving circuit and the second driving circuit comprises:
a high-side transistor, providing a supply voltage to a driving node according to a high-side voltage of a high-side node;
a low-side transistor, coupling the driving node to a ground according to a first internal signal; and
a charge pump, coupled to the high-side node and the driving node, wherein the charge pump is configured to generate a high-side voltage that exceeds the supply voltage according to the first internal signal.

45. The method of claim 44, wherein each of the first power circuit and the second power circuit comprises:
a hysteresis circuit, coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.

* * * * *